(12) United States Patent
Inoue et al.

(10) Patent No.: US 8,248,073 B2
(45) Date of Patent: Aug. 21, 2012

(54) SEMICONDUCTOR INTEGRATED CIRCUIT AND TESTING METHOD THEREFOR

(75) Inventors: Hiroaki Inoue, Tokyo (JP); Masamichi Takagi, Tokyo (JP)

(73) Assignee: NEC Corporation, Tokyo (JP)

( * ) Notice: Subject to any disclaimer, the term of this patent is extended or adjusted under 35 U.S.C. 154(b) by 540 days.

(21) Appl. No.: 12/529,458

(22) PCT Filed: Feb. 19, 2008

(86) PCT No.: PCT/JP2008/052681
§ 371 (c)(1),
(2), (4) Date: Sep. 1, 2009

(87) PCT Pub. No.: WO2008/126471
PCT Pub. Date: Oct. 23, 2008

(65) Prior Publication Data
US 2010/0070802 A1    Mar. 18, 2010

(30) Foreign Application Priority Data

Apr. 6, 2007 (JP) .................................. 2007-100730

(51) Int. Cl.
*G01V 3/00* (2006.01)
(52) U.S. Cl. ........................................ 324/322; 324/300
(58) Field of Classification Search .......... 324/300–322; 600/407–445
See application file for complete search history.

(56) References Cited

U.S. PATENT DOCUMENTS

| | | | |
|---|---|---|---|
| 7,345,495 B2 * | 3/2008 | Dangelo et al. | 324/750.06 |
| 2006/0242499 A1 | 10/2006 | Volz | |
| 2010/0038625 A1 * | 2/2010 | Bertin | 257/9 |
| 2011/0201916 A1 * | 8/2011 | Duyn et al. | 600/410 |

FOREIGN PATENT DOCUMENTS

| | | |
|---|---|---|
| JP | 11-112658 A | 4/1999 |
| JP | 2001165998 A | 6/2001 |
| JP | 2002157900 A | 5/2002 |
| JP | 2003004807 A | 1/2003 |
| JP | 2004500712 A | 1/2004 |
| JP | 2005508593 A | 3/2005 |
| JP | 2005249781 A | 9/2005 |
| JP | 2006502487 A | 1/2006 |
| JP | 3791859 B | 4/2006 |
| JP | 2006518855 A | 8/2006 |

OTHER PUBLICATIONS

International Search Report for PCT/JP2008/052681 mailed May 27, 2008.

* cited by examiner

*Primary Examiner* — Brij Shrivastav

(57) ABSTRACT

A semiconductor integrated circuit comprises a plurality of cores (99) connected with an inter-connection network (1000) and a test controller (500) which is connected with the inter-connection network (1000) and which issues a test control request associated with the test of the core (99) via the inter-connection network (1000). The inter-connection network (1000) is constituted of a plurality of adapters (3000) which serve as connection interfaces of the plurality of cores (99) and the test controller (500), respectively, and a plurality of routers (2000) which connect the plurality of adapters (3000). The adapters (3000) connected with the core (99) comprise a core testing unit for vicariously testing core (99) connected to itself based on the test control request received from the test controller (500) via the inter-connection network (1000).

22 Claims, 21 Drawing Sheets

SEMICONDUCTOR INTEGRATED CIRCUIT AND TESTING METHOD THEREFOR

This application is the National Phase of PCT/JP2008/052681, filed Feb. 19, 2008, which claims the priority based on Japanese Patent Application No. 2007-100730 filed Apr. 6, 2007, the disclosure of which is incorporated herein by reference in its entirety.

TECHNICAL FIELD

The present invention relates to a semiconductor integrated circuit which comprises a plurality of cores connected to an inter-connection network and a testing method therefor, and more particularly, to a semiconductor integrated circuit and a testing method therefor which can flexibly conduct a test at high speeds by making use of the inter-connection network.

BACKGROUND ART

With the advance in miniaturization of semiconductors, future semiconductor integrated circuits are expected to have mounted thereon a large number of cores such as CPU, processing circuits and the like. However, the test times for a semiconductor integrated circuit becomes longer as the number of cores increases more and more, as a matter of course. To reduce test times, it is essential to accomplish both collective testing of a plurality of cores in parallel and testing of cores under test in various orders.

FIG. 1 is a schematic diagram showing an exemplary configuration of a related semiconductor integrated circuit.

The example shown in FIG. 1 is provided with a plurality of scan chains 20010P1~Pn and compactor 20100. Compactor 20100 comprises an injector network 20110 for generating an intermediate value from the results of tests by plurality of scan chains 20010P1~Pn, and memory element 20120 for storing the generated intermediate value. In this way, tests can be conducted in parallel in plurality of scan chains 20010P1~Pn, so that the results of these tests can be compressed.

However, the example shown in FIG. 1 implies the following problem.

Since all of the scan chains must be utilized together, a particular core alone cannot be tested, or a particular scan chain alone cannot test cores.

There is an information processing apparatus as described in Patent Document 1, as a technique comparable to the foregoing. Patent Document 1 discloses a compactor, similar to the example shown in FIG. 1. Accordingly, the technique described in Patent Document 1 implies the same problem as the example shown in FIG. 1.

FIG. 2 is a schematic diagram showing another exemplary configuration of a related semiconductor integrated circuit.

The example shown in FIG. 2 is provided with a plurality of scan chains 30010P1~Pn connected to a plurality of cores 30020P1~Pn, respectively. The example is further provided with core switching unit 30100 for switching inputs to the plurality of scan chains 30010P1~Pn, and a switching control unit 30200 for controlling core switching unit 30100. In this way, a particular core alone can be tested among a plurality of cores 30020P1~Pn.

However, the example shown in FIG. 2 implies the following problem.

Due to connections through the switching unit, the connections of the scan chains are previously fixed, so that flexible tests cannot be conducted according to a load, such as a change in the order of testing cores, grouping of cores under test, and the like.

There is an information processing apparatus as described in Patent Document 2, as a technique comparable to the foregoing. Patent Document 2 discloses integrated circuit switching means equivalent to the core switching unit, similar to the example shown in FIG. 2. Accordingly, the technique described in Patent Document 2 implies the same problem as the example shown in FIG. 2.

FIG. 3 is a schematic diagram showing a further exemplary configuration of a related semiconductor integrated circuit.

The example shown in FIG. 3 is provided with an inter-connection network 10200 comprised of routers 10100A and 10100B, and master core 10010 and slave core 10020 are connected through this inter-connection network 10200. In this way, since the connection between master core 10010 and slave core 10020 is virtualized through network-based coupling, the two parts can be connected by way of various paths.

However, the example shown in FIG. 3 implies the following problem.

Though supporting communications between the cores, the example does not at all consider a test for the connected cores.

There is an information processing apparatus as described in Patent Document 3 as a technique comparable to the foregoing. Patent Document 3 discloses an inter-connection network, similar to the example shown in FIG. 3. Accordingly, the technique described in Patent Document 3 implies the same problem as the example shown in FIG. 3.

As described above, in a semiconductor integrated circuit comprising a plurality of cores connected to an inter-connection network, in order to accommodate an increased number of cores resulting from increased miniaturization of semiconductors, it is necessary to reconcile both collective testing of a plurality of cores in parallel, and testing of cores under test in various orders, but a problem arises in that the reconcilement is difficult to achieve with the related techniques described above.

Patent Document 1: JP-2006-518855A
Patent Document 2: Japanese Patent No. 3791859
Patent Document 3: JP-2006-502487A

DISCLOSURE OF THE INVENTION

It is therefore an object of the present invention to provide a semiconductor integrated circuit and a testing method therefor which solve the problems mentioned above.

The present invention for achieving the above object is applied to a semiconductor integrated circuit comprising a plurality of cores connected to an inter-connection network, and a testing method therefor, which are summarized as follows.

Specifically, the semiconductor integrated circuit of the present invention is characterized by comprising a test controller connected to the inter-connection network for issuing a test control request related to testing of the cores through the inter-connection network, wherein the inter-connection network comprises a plurality of adapters which serve as connection interfaces for the plurality of cores and the test controller, respectively, and a plurality of routers for connecting between the plurality of adapters, and the adapter connected to the core comprises a core testing unit for conducting a test for the core connected to the adapter, in place of the test controller, based on the test control request received from the test controller through the inter-connection network.

On the other hand, the method of testing a semiconductor integrated circuit of the present invention involves the provision of a test controller for connection to the inter-connection network, where the inter-connection network comprises a plurality of adapters which serve as connection interfaces for the plurality of cores and the test controller, respectively, and a plurality of routers for connecting between the plurality of adapters, and is characterized by comprising a test control request issuing step where the test controller issues a test control request related to testing the cores through the inter-connection network, and a core test acting step where a core testing unit within the adapter connected to the core conducts a test for the core connected to the adapter, in place of the test controller, based on the test control request received from the test controller through the inter-connection network.

According to this configuration, the test controller controls the core testing unit by transmitting a test control request through the inter-connection network, and the core testing unit acts for the test controller to conduct a test for a core, which should essentially be executed by the test controller.

Accordingly, testing a plurality of cores collectively in parallel can be reconciled with testing cores under test in various orders, so that the test can be flexibly conducted at high speeds, with the result that test times can be advantageously reduced for semiconductor integrated circuits.

Notably, this advantage cannot be achieved simply by a configuration using the inter-connection network, but can be achieved only after including a function for transmitting/receiving a test control request for a test between the test controller and core testing unit for purposes of the core test.

BEST MODE FOR CARRYING OUT THE INVENTION

In the following, the best mode for carrying out the present invention will be described with reference to the drawings.

Figure 1:
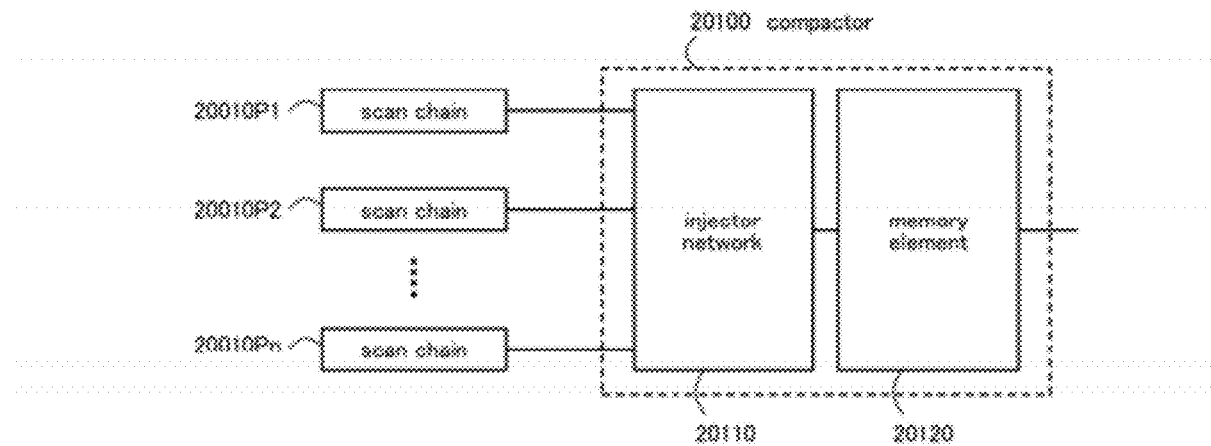
[FIG. 1] A diagram showing an exemplary configuration of a related semiconductor integrated circuit.
Figure 2:
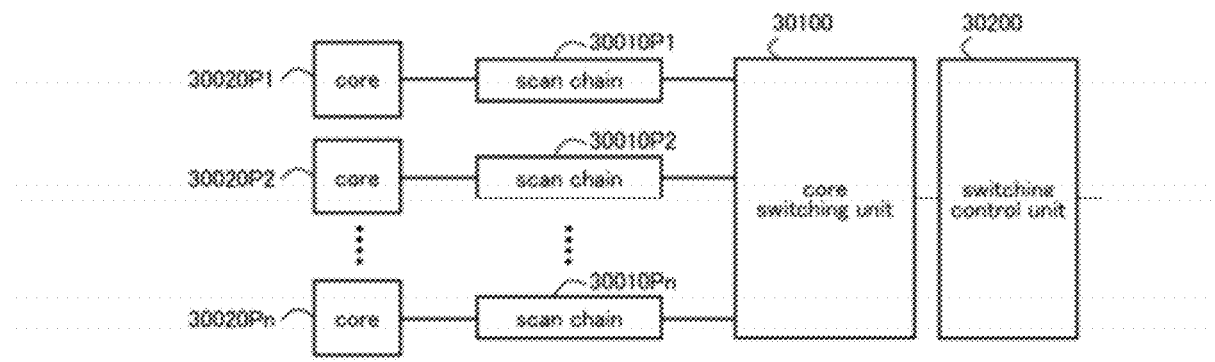
[FIG. 2] A diagram showing an exemplary configuration of another related semiconductor integrated circuit.
Figure 3:
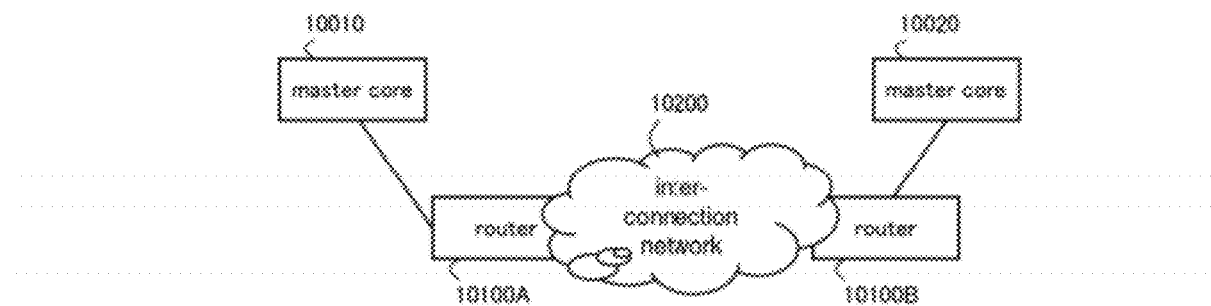
[FIG. 3] A diagram showing an exemplary configuration of a further related semiconductor integrated circuit.
Figure 4:
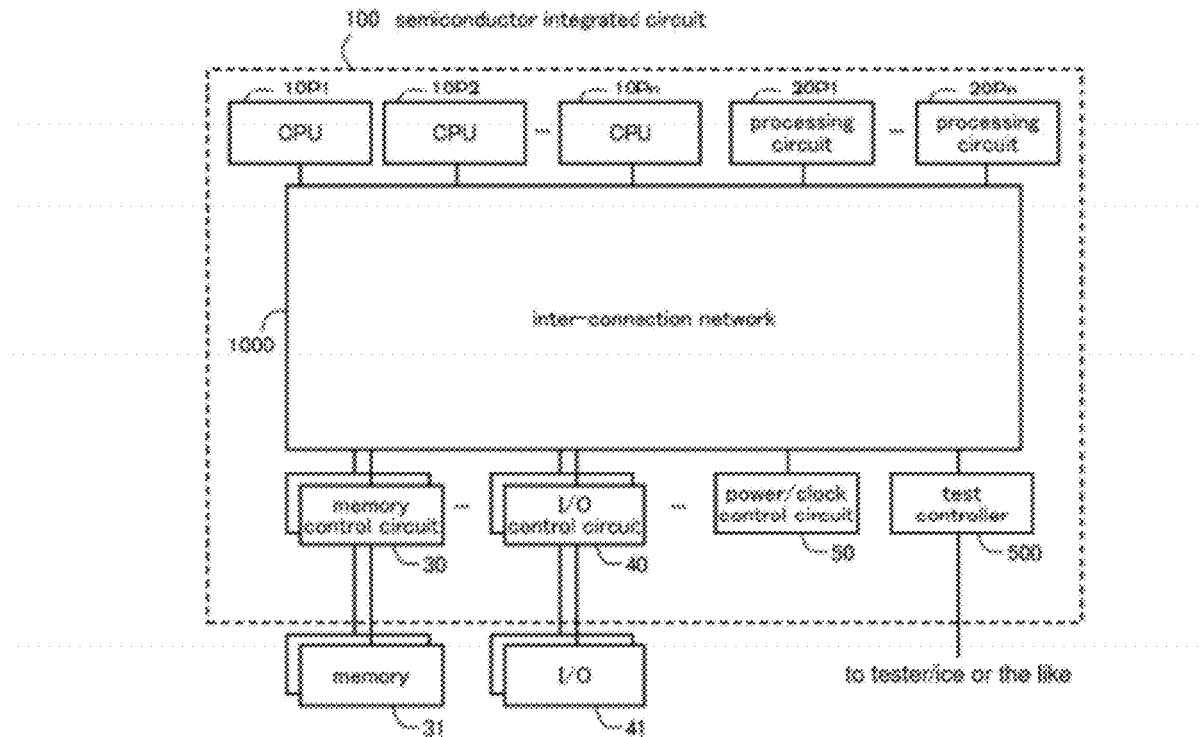
[FIG. 4] A diagram showing the general configuration of a semiconductor integrated circuit according to the present exemplary embodiment.

FIG. 4 is a diagram showing an exemplary general configuration of semiconductor integrated circuit 100 according to the present exemplary embodiment.

Referring to FIG. 4, semiconductor integrated circuit 100 comprises CPUs 10P1~Pn, processing circuits 20P1~Pn, memory control circuit 30 connected to external memory 31, I/O control circuit 40 connected to external I/O 41, test controller 500 connected to an external tester, ICE (In Circuit Emulator) or the like, and inter-connection network 1000 through which CPUs 10P1~Pn, processing circuits 20P1~Pn, memory control circuit 30, I/O control circuit 40, and test controller 500 are connected with one another.

In this regard, semiconductor integrated circuit 100 can be composed of separate packages each of which contains one of the foregoing components. Alternatively, semiconductor integrated circuit 100 may be in an SoC (System On Chip) configuration which involves mounting the foregoing components on a single chip, in an SiP (System in Package) configuration which involves manufacturing the foregoing components as separate chips and connecting among the chips, in a three-dimensional LSI configuration, or in a configuration of combined three-dimensional LSIs.

CPU 10P1~10Pn is a processing unit which is capable of program operations for a signal processing processor, a VLIW (Very Long Instruction Word) processor, a configurable processor, and the like.

Processing circuit 20P1~Pn is a processing unit for mainly performing data processing for an accelerator, a dynamically reconfigurable circuit, and the like.

Power supply/clock control circuit 50 conducts control for supplying each circuit with power and clock. Power supply/clock control circuit 50 may also comprise a common control function such as interrupt control and temperature control.

Figure 5:
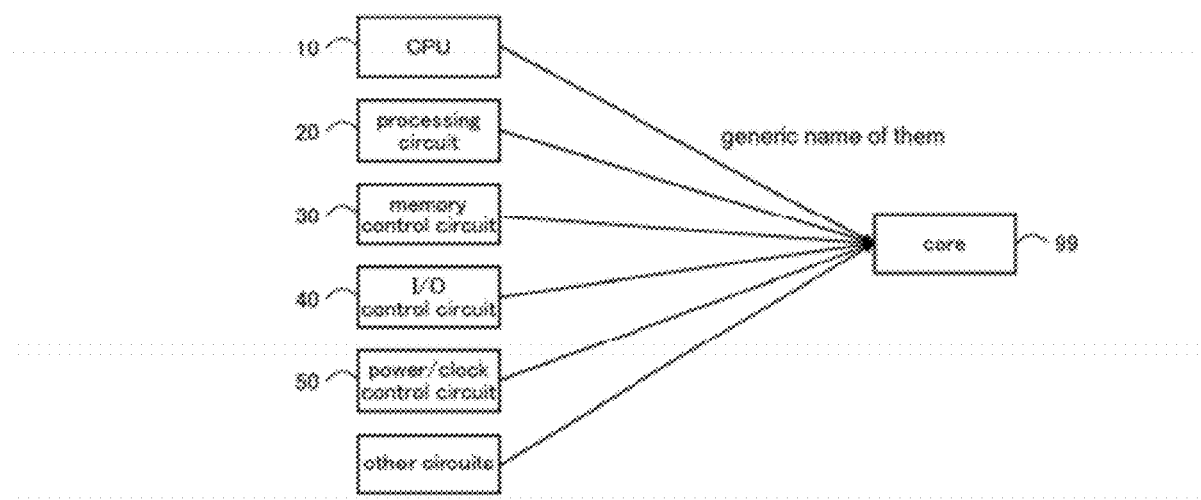
[FIG. 5] A diagram for describing a core according to the present exemplary embodiment.

FIG. 5 is a diagram for describing a core in semiconductor integrated circuit 100.

Referring to FIG. 5, each circuit of CPU 10, processing circuit 20, memory control circuit 30, I/O control circuit 40, power supply/clock control circuit 50 and the like is hereinafter represented by "core 99" in a collective manner. Stated another way, this means that a circuit represented by core 99 does not depend on a particular circuit type.

Test controller 500, which is one of the characterizing parts of the present invention, is connected to a tester, ICE or the like and plays a role of controlling tests within semiconductor integrated circuit 100. Test controller 500 is a processing unit capable of program operations, such as a CPU, signal processing processor, VLIW processor, configurable processor, or a combination of these processing units. With this feature, an appropriate function can be implemented according to a situation during a testing work.

Test controller 500 issues a test control request related to core 99 under test through inter-connection network 1000. This test control request is copied by adapter 3000 (refer to FIG. 6) connected to test controller 500 within inter-connection network 1000, and is transferred to adapter 3000 connected to core 99 under test by use of multicasting, broadcasting or the like. Within adapter 3000 which receives the test control request, core testing unit 3300 (see FIG. 17) executes a test of core 99 for test controller 500 under the test control request. In this way, not only a plurality of cores 99 can be collectively tested in parallel, but also cores 99 under test can be implemented in various orders, thus resulting in a reduction in test time.

Test controller 500 arranges in order the results, which are responses to the test control request, of tests received from cores 99. In this way, cores 99 can be virtually connected to one another.

Further, test controller 500 compares test results received from cores 99 with one another. In this way, test controller 500 can detect which core 99 fails without use of a tester, ICE or the like, and as a result, can further reduce test times.

In this regard, while FIG. 4 illustrates only one test controller 500, a plurality of test controllers 500 may be provided in semiconductor integrated circuit 100.

Also, test controller 500 may be connected not only to a tester and ICE, but also to any circuit related to a test, such as a testing circuit within semiconductor integrated circuit 100, and a testing circuit stacked on semiconductor integrated circuit 100. Also, test controller 500 is not at all limited in methods of connecting with, the foregoing destinations, connection form, or connection topology.

Figure 6:
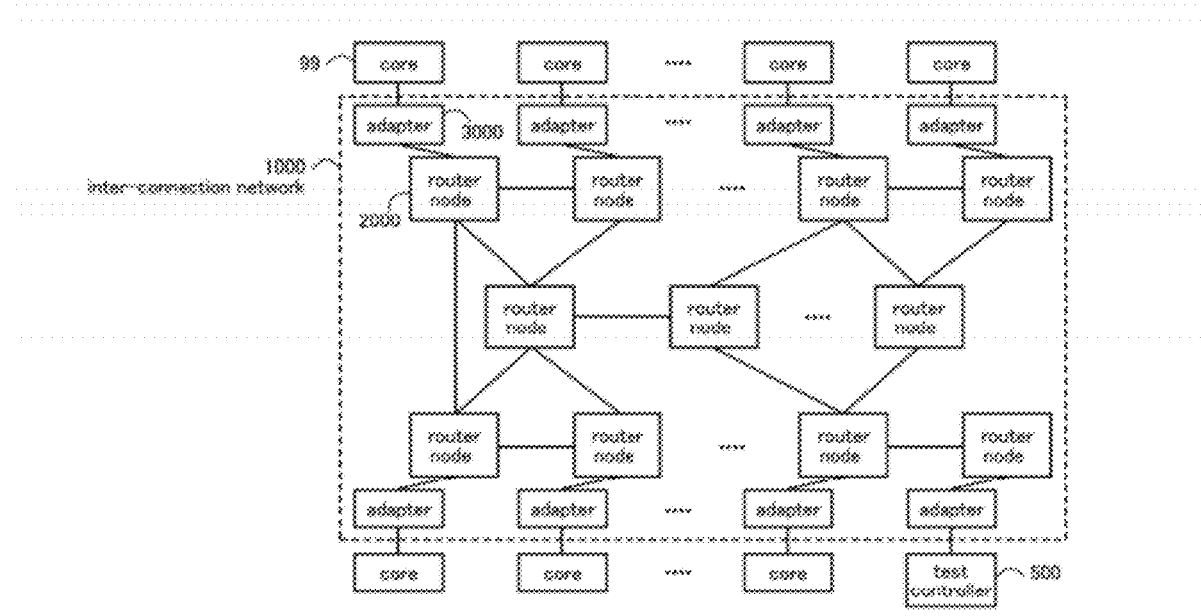
[FIG. 6] A diagram showing the configuration of an inter-connection network according to the present exemplary embodiment.

FIG. 6 is a diagram showing an exemplary general configuration of inter-connection network 1000.

Referring to FIG. 6, inter-connection network 1000, through which a plurality of cores 99 and test controller 500 are connected, comprises a plurality of adapters 3000 which serve as connection interfaces for the plurality of cores 99 and test controller 500, respectively, and a plurality of router nodes 2000 which are routers connecting between the plurality of adapters 3000.

Adapter 3000 converts a signal received from core 99 or test controller 500 into a packet (see FIGS. 8 and 16) in a packet configuration which can be transferred within inter-connection network 1000, and transmits the packet to router node 2000. Adapter 3000 also converts a packet received from router node 2000 into a signal which can be processed by core 99 or test controller 500, and transmits the signal to core 99 or test controller 500.

Router node 2000 transmits a packet received from adapter 3000 or adjacent router node 2000 to adjacent router node 2000 or adapter 3000 in accordance with destination information described in the header of the packet.

In FIG. 6, adapter 3000 is illustrated as means independent of router node 2000, core 99, and test controller 500, but adapter 3000 may be embedded in router node 2000 or in core 99 or test controller 500 provided that it comprises the aforementioned packet conversion function.

Figure 7:
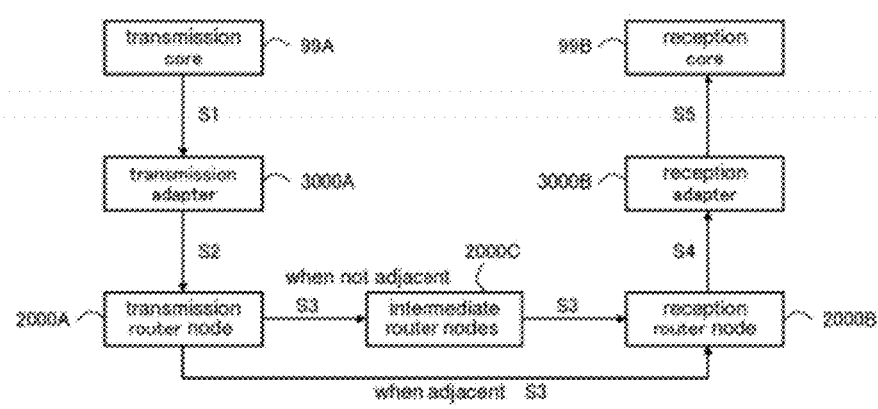
[FIG. 7] A diagram for describing operations of a router node and an adapter according to the present exemplary embodiment.

FIG. 7 is a diagram for describing exemplary operations of router node 2000 and adapter 3000 shown in FIG. 6. In FIG. 7, a reference comprised of "S" and a number beside an arrow represents a step number. Described in this example are operations which are involved when transmission core 99A transmits an access request such as a read access or a write access to reception core 99B through transmission adapter 3000A, transmission router node 2000A, reception router node 2000B, and reception adapter 3000B.

Step 1 (S1): Transmission core 99A transmits an access request to transmission adapter 3000A as a core transmission signal (see FIG. 13).

Step 2 (S2): Transmission adapter 3000A converts the access request received from transmission core 99A into a packet in a packet configuration which can be transferred within inter-connection network 1000. The converted packet is transmitted to transmission router node 2000A.

Step 3 (S3): Transmission router node 2000A transmits the packet received from transmission adapter 3000A to adjacent router node 2000 in accordance with destination information described in the header of the packet. The packet arrives at reception router node 2000B by way of various intermediate router nodes 2000C as long as that adjacent router node 2000 is not reception router node 2000B connected to reception core 99B.

Step 4 (S4): Reception router node 2000B determines whether or not the packet arriving from transmission router node 2000A is a packet which should be processed by reception core 99B connected to reception router node 2000B itself, based on the destination information described in the header of the packet. Reception router node 2000B transmits the packet to reception adapter 3000B when it determines that the packet should be processed by reception core 99B.

Step 5 (S5): Reception adapter 3000B analyzes and deploys the packet received from reception router node 2000B to convert the packet into a core reception signal (see FIG. 13) which can be processed by reception core 99B, and transmits the converted core reception signal to reception core 99B.

Figure 8:
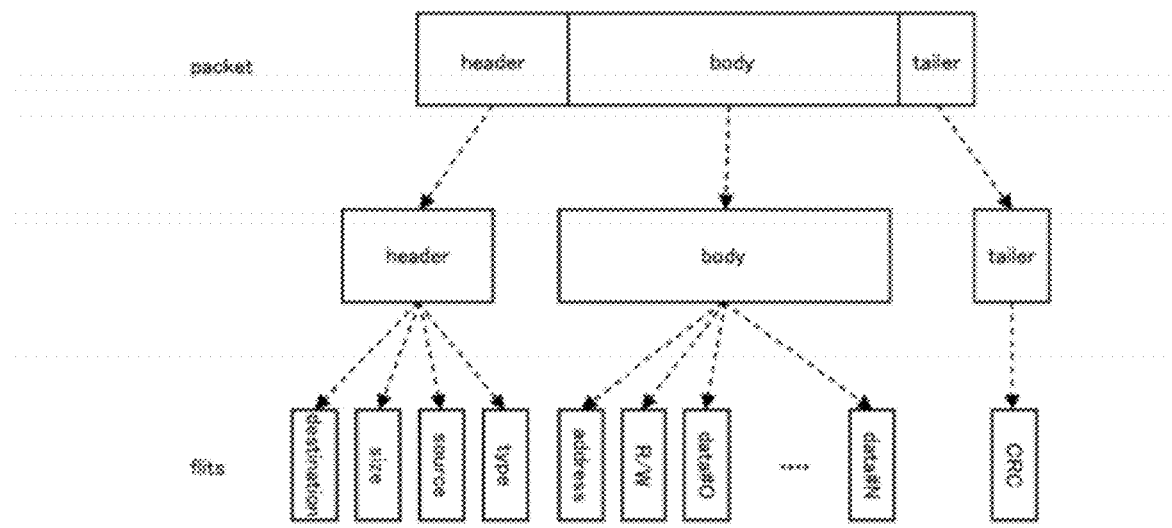
[FIG. 8] A diagram showing the packet configuration of a normal packet which is transferred within the inter-connection network according to the present exemplary embodiment.

FIG. 8 is a diagram showing a typical packet configuration for a packet transferred within inter-connection network 1000. In this regard, the packet shown in FIG. 8 is a packet other than a test packet which is used for processing a test control request issued from test controller 500 and is a response to the test control request, and is referred to as a normal packet for distinguishing it from the test packet.

Referring to FIG. 8, the normal packet comprises three parts: a header which describes control information on router node 2000, a body which describes information on access to core 99, and a tailer for guaranteeing the validity of the packet. Each part is divided into smaller units called "flits" upon transfer between router nodes 2000. For example, the header is divided into flits which describe a destination node, a packet size, a source node, and a packet type, respectively. The body in turn is divided into flits which describe the address of a memory, an access type such as read and write, and write data for a write access, respectively, when a destination core is the memory. Further, the taller is divided into flits which describe CRC (Cyclic Redundancy Code) of the whole packet.

As will be understood, the packet configuration and flit configuration of the normal packet shown in FIG. 8 are illustrative in all senses, and are not at all limited as long as they conform to the specifications of router node 2000 which form parts of inter-connection network 1000.

Figure 9:
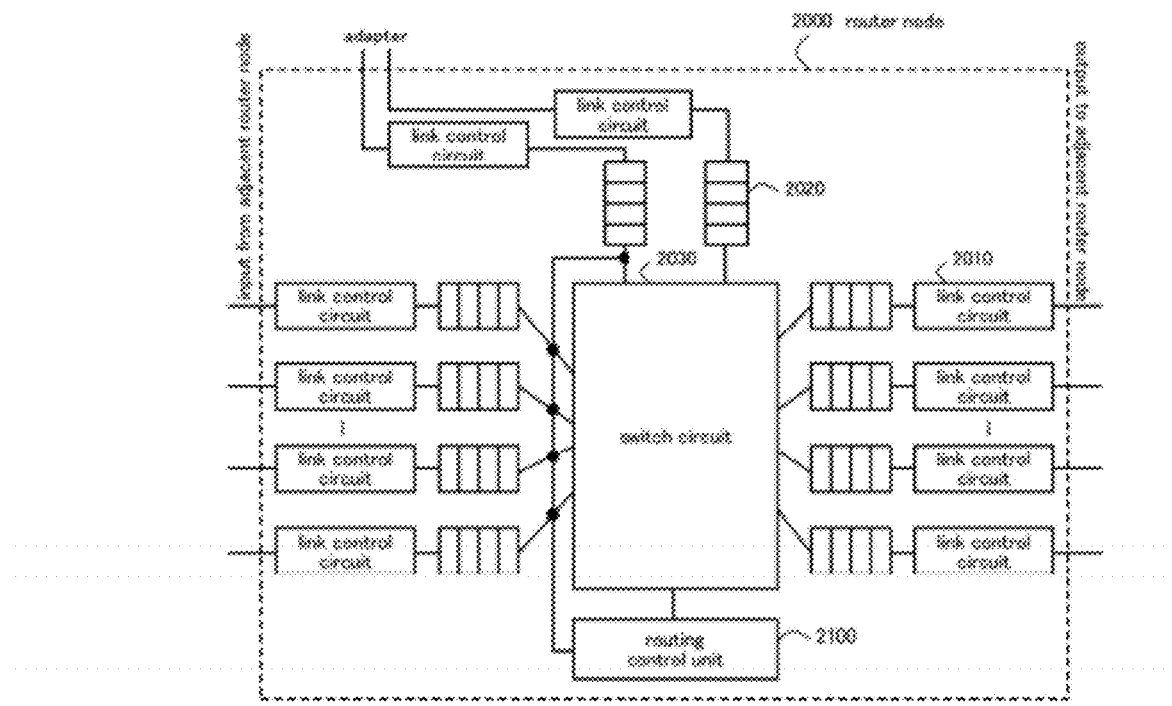
[FIG. 9] A diagram showing the configuration of a router node according to the present exemplary embodiment.

FIG. 9 is a diagram showing a typical configuration of router node 2000.

Referring to FIG. 9, router node 2000 comprises a plurality of channels for inputs with adjacent router nodes 2000, a plurality of channels for outputs with adjacent router nodes 2000, and one channel each for input and output with adapter 3000. Each channel is comprised of link control circuit 2010 for conducting flow control for a connection link and the like, and buffer 2020 for temporarily storing a packet. Further, router node 2000 comprises switch circuit 2030 for connecting between channels for input and output, and routing control unit 2100 for notifying a channel which is to be connected at switch circuit 2030. Alternatively, a plurality of channels may be provided for input and output with adapter 3000, not limited to one channel. In this event, the number of channels may be increased for connecting adapter 3000 with switch circuit 2030.

Link control circuit 2010 communicates packets in a link-to-link basis (between adjacent router nodes) instead of end-to-end basis. In this way, a transmission can be stopped, for example, when data is transferred using a hand shake signal, or when a buffer at the destination is full.

Switch circuit 2030 connects an input channel with an output channel based on a notification from routing control unit 2100. For example, switch circuit 2030 is a multi-stage connection network represented by a cross bar switch and an omega network, a connection network connected to a network, or the like.

Routing control unit 2100 determines, based on destination information described in the header of a packet received from an input channel with adjacent router node 2000 or adapter 3000, to which output channel the input channel should be connected, and notifies switch circuit 2030 of the determined output channel. Additionally, routing control unit 2100 may comprise a function for preventing starvation or dead lock on a channel, and the like.

Alternatively, router node 2000 may be a router node which employs virtual channels.

Figure 10:
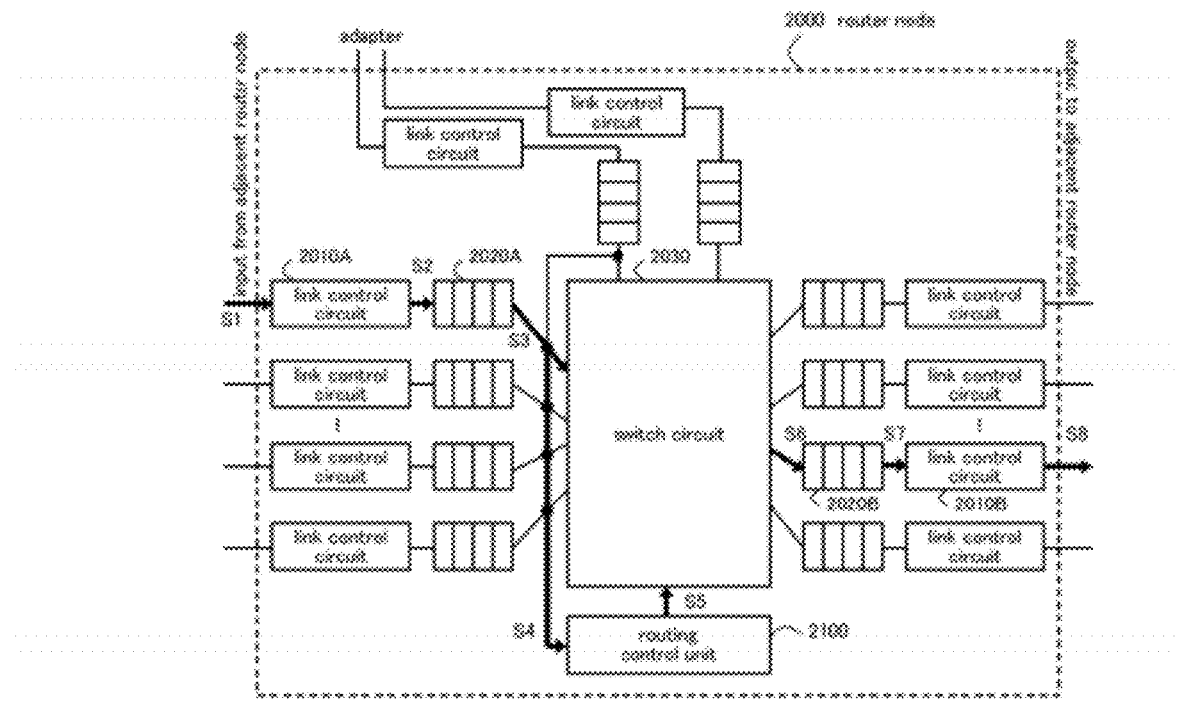
[FIG. 10] A diagram for describing operations of the router node according to the present exemplary embodiment.

FIG. 10 is a diagram for describing exemplary operation of router node 2000 shown in FIG. 9. In FIG. 10, a reference comprised of "S" and a number beside an arrow represents a step number. Described in this example are operations which are involved when router node 2000 receives a packet from adjacent router node 2000, and transmits the packet to another adjacent router node 2000.

Step 1 (S1): Link control circuit 2010A receives a packet from adjacent router node 2000.

Step 2 (S2): Link control circuit 2010A stores the packet in input buffer 2020A.

Step 3 (S3): Input buffer 2020A connects its own output to an input of switch circuit 2030.

Step 4 (S4): Routing control unit 2100 determines output buffer 2020B to which input buffer 2020A is to be connected, based on destination information described in the header of the packet stored in input buffer 2020A.

Step 5 (S5): Routing control unit 2100 notifies switch circuit 2030 of the output buffer 2030B determined at step 4.

Step 6 (S6): Switch circuit 2030 connects input buffer 2020A with output buffer 2020B, and stores the packet stored in input buffer 2020A in output buffer 2020B.

Step 7 (S7): Link control circuit 2010B reads the packet stored in output buffer 2020B, and starts preparing a transfer to adjacent router node 2000.

Step 8 (S8): Link control circuit 2010B transmits the packet read from output buffer 2020B to adjacent router node 2000.

Figure 11:
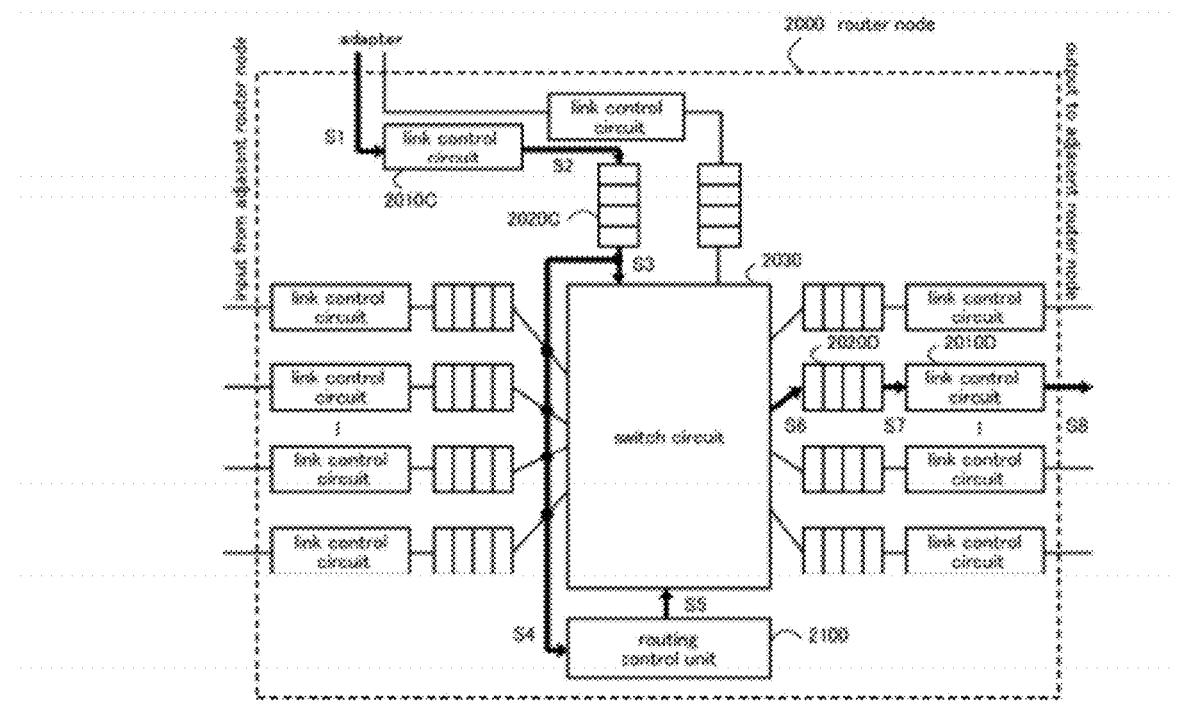
[FIG. 11] A diagram for describing operations of the router node according to the present exemplary embodiment.

FIG. 11 is a diagram for describing exemplary operations of router node 2000 shown in FIG. 9. In FIG. 11, a reference comprised of "S" and a number beside an arrow represents a step number. Described in this example are operations which are involved when router node 2000 receives a packet from adapter 3000, and transmits the packet to adjacent router node 2000.

Step 1 (S1): Link control circuit 2010C receives a packet from adapter 3000.

Step 2 (S2): Link control circuit 2010C stores the packet in input buffer 2020C.

Step 3 (S3): Input buffer 2020C connects its own output to an input of switch circuit 2030.

Step 4 (S4): Routing control unit 2100 determines output buffer 2020D to which input buffer 2020C is to be connected, based on destination information described in the header of the packet stored in input buffer 2020C.

Step 5 (S5): Routing control unit 2100 notifies switch circuit 2030 of output buffer 2020D determined at step 4.

Step 6 (S6): Switch circuit 2030 connects input buffer 2020C with output buffer 2020D, and stores the packet stored in input buffer 2020C in output buffer 2020D.

Step 7 (S7): Link control circuit 2010D reads the packet stored in output buffer 2020D, and starts preparing a transfer to adjacent router node 200.

Step 8 (S8): Link control circuit 2010D transmits the buffer read from output buffer 2020D to adjacent router node 2000.

Figure 12:
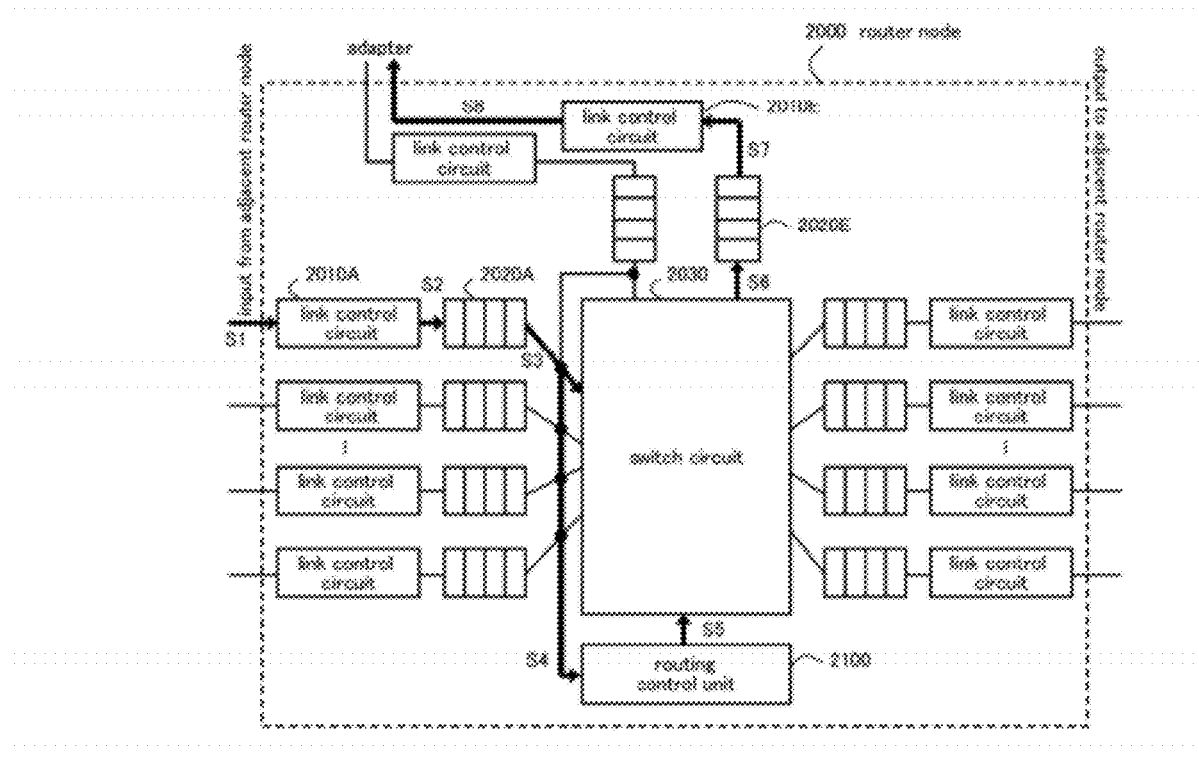
[FIG. 12] A diagram for describing operations of the router node according to the present exemplary embodiment.

FIG. 12 is a diagram for describing exemplary operations of router node 2000 shown in FIG. 9. In FIG. 12, a reference comprised of "S" and a number beside an arrow represents a step number. Described in this example are operations which are involved when router node 2000 receives a packet from adjacent router node 2000, and transmits the packet to adapter 3000.

Step 1 (S1): Link control circuit 2010A receives a packet from adjacent router node 2000.

Step 2 (S2): Link control circuit 2010A stores the packet in input buffer 2020A.

Step 3 (S3): Input buffer 2020A connects its own output to an input of switch circuit 2030.

Step 4 (S4): Routing control unit 2100 determines that the packet must be transmitted to adapter 3000, based on destination information described in the header of the packet stored in input buffer 2020A, and determines output buffer 2020E to which input buffer 2020A is to be connected.

Step 5 (S5): Routing control unit 2100 notifies switch circuit 2030 of output buffer 2020E determined at step 4.

Step 6 (S6): Switch circuit 2030 connects input buffer 2020A with output buffer 2020E, and stores the packet stored in input buffer 2020A in output buffer 2020E.

Step 7 (S7): Link control circuit 2010E reads the packet stored in output buffer 2020E, and starts preparing a transfer to adapter 3000.

Step 8 (S8): Link control circuit 2010E transmits the packet read from output buffer 2020E to adapter 3000.

Figure 13:
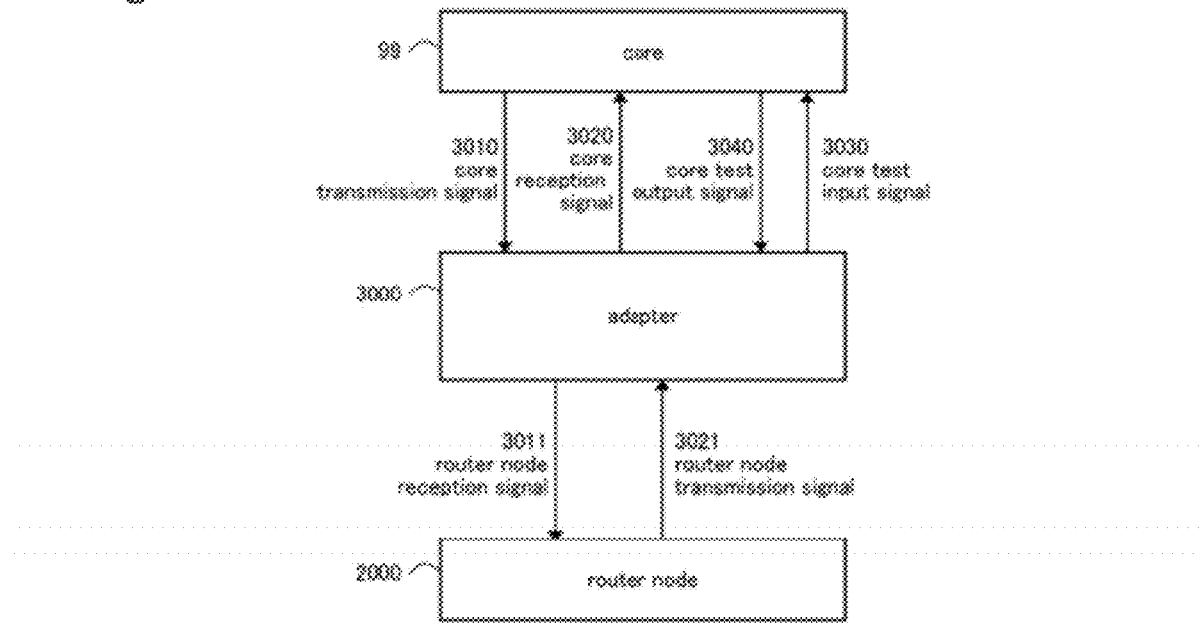
[FIG. 13] A diagram showing a connection relationship of the adaptor according to the present exemplary embodiment.

FIG. 13 is a diagram showing a typical connection relationship of adapter 3000. Specifically, FIG. 13 shows a connection relationship of adapter 3000 connected to core 99.

Referring to FIG. 13, adapter 3000 is connected to core 99 through signal lines for core transmission signal 3010 from core 99 and core reception signal 3020 to core 99. Adapter 3000 is also connected to router node 2000 through signal lines for router node reception signal 3011 to router node 2000 and router node transmission signal 3021 from router node 2000. Adapter 3000 is further connected to core 99 through signal lines for core test input signal 3030 to core 99 and core test output signal 3040 from core 99. In this regard, the signal lines for core test input signal 3030 and core test output signal 3040 are connected to test signal lines defined by a scan chain and JTAG (Joint Test Action Group) by way of core 99.

Notably, core transmission signal 3010, core reception signal 3020, core test input signal 3030, and core test output signal 3040 are signals which can be processed by core 99. Here, core test input signal 3030 and core test output signal 304 are signals for use in processing of a test control request issued from test controller 500 and a response to the test control request, while core transmission signal 3010 and core reception signal 3020 are signals for use in processing other than the foregoing test control request. On the other hand, router node reception signal 3011 and router node transmission signal 3021 are packet signals for communicating a packet.

Figure 14:
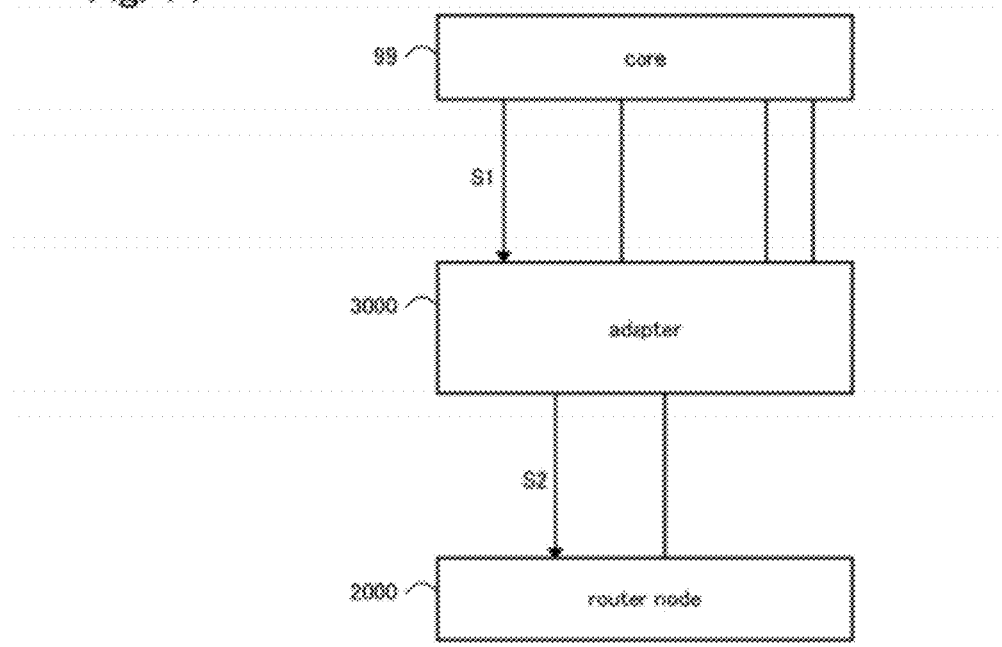
[FIG. 14] A diagram for describing operations of the adaptor according to the present exemplary embodiment.

FIG. 14 is a diagram for describing exemplary operations of adapter 3000 shown in FIG. 13. In FIG. 14, a reference comprised of "S" and a number beside an arrow represents a step number. Described in this example are operations which are involved when adapter 3000 receives core transmission signal 3010 from core 99.

Step 1 (S1): Adapter 3000 receives core transmission signal 3010 from core 99.

Step 2 (S2): Adapter 3000 converts core transmission signal 3010 received from core 99 into a packet, and transmits the converted packet to router node 2000 as router node reception signal 3011.

Figure 15:
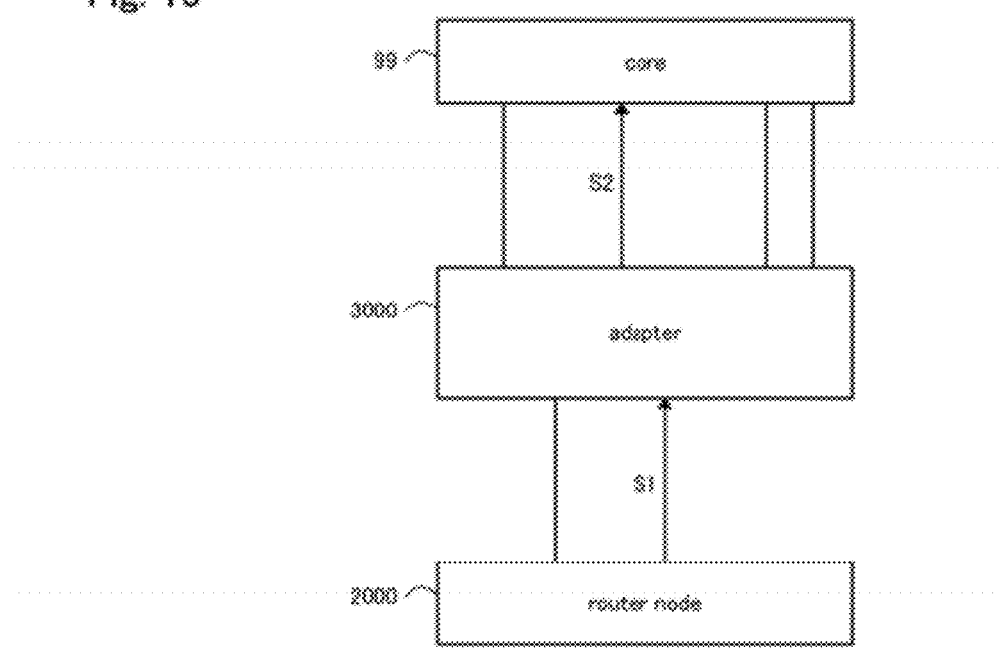
[FIG. 15] A diagram for describing operations of the adaptor according to the present exemplary embodiment.

FIG. 15 is a diagram for describing exemplary operations of adapter 3000 shown in FIG. 13. In FIG. 15, a reference comprised of "S" and a number beside an arrow represents a step number. Described in this example is processing which are involved when adapter 3000 receives router node transmission signal 3021 from router node 2000.

Step 1 (S1): Adapter 3000 receives a packet from router node 2000 as router node transmission signal 3021.

Step 2 (S2): Adapter 3000 converts the packet received from router node 2000 into core reception signal 3020, and transmits converted core reception signal 3020 to core 99.

Figure 16:
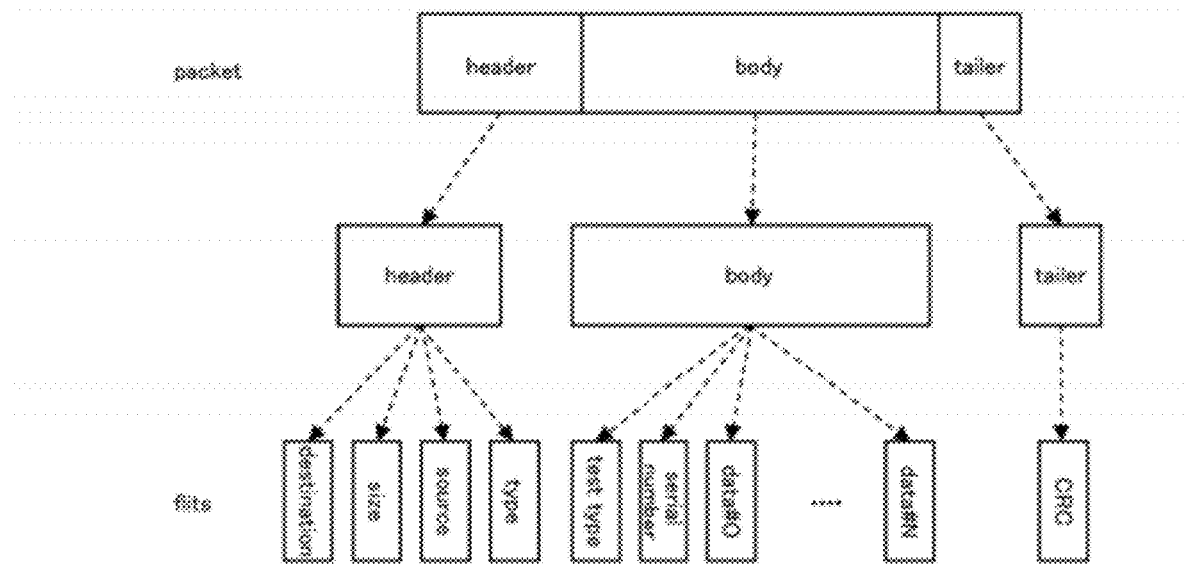
[FIG. 16] A diagram showing the packet configuration of a test packet which is transferred within the inter-connection network according to the present exemplary embodiment.

FIG. 16 is a diagram showing a typical configuration of a test packet transferred within inter-connection network 1000. The test packet is a packet for use in processing of a test control request issued from test controller 500 and a response to the test control request, as mentioned above.

Referring to FIG. 16, the test packet differs from the normal packet shown in FIG. 8 in the body part. The body part of the test packet describes a packet type which is injection of test data for use in execution of a test into core 99, execution of a test on core 99 using the test data, extraction of the result of the test from core 99, and the like, a sequential number combined with a node number of router node 2000 to implement a virtual connection between cores 99, and data which is the test data and response data (data which represents the test result, comparison result, later described, and the like).

In this regard, the test data refers to data used during the execution of a test on core 99, as described above. For example, in a scan test which is one type of a structure test for core 99, the test data is the value of "0" or "1" which is applied to scan input SI of core 99.

Test controller 500 arranges the order of test results using the sequential numbers of test packets and node numbers of router nodes 2000. In this way, cores 99 can be virtually connected to one another independently of the actual order in which test packets arrive.

As will be understood, the packet configuration and flit configuration of the test packet shown in FIG. 16 are illustrative in all senses, and are not at all limited as long as they conform to the specifications of router node 2000 which forms part of inter-connection network 1000.

Figure 17:
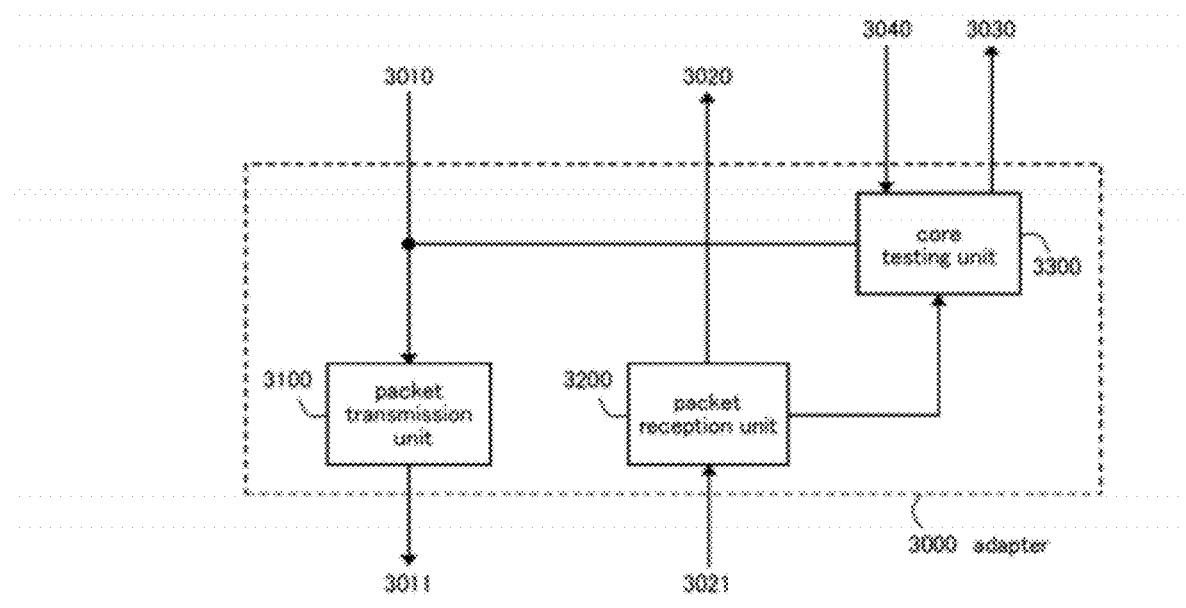
[FIG. 17] A diagram showing the configuration of the adapter according to the present exemplary embodiment.

FIG. 17 is a diagram showing a typical configuration of adapter 3000. Specifically, FIG. 17 shows the configuration of adapter 3000 connected to core 99.

Referring to FIG. 17, adapter 3000 comprises packet transmission unit 3100 for transmitting a packet to router node 2000, packet reception unit 3200 for receiving a packet from router node 2000, and core testing unit 3300 which is one of the characteristic parts of the present invention.

Upon receipt of core transmission signal 3010 from core 99, packet transmission unit 3100 converts this core transmission signal 3010 into a packet in a packet configuration which can be transferred within inter-connection network 1000, and transmits the packet to router node 2000 as router node reception signal 3011. Also, upon passage of a test packet from core testing unit 3300, packet transmission unit 3100 transmits the test packet to router node 2000 as router node reception signal 3011.

Upon receipt of a normal packet from router node 2000, packet reception unit 3200 converts the normal, packet into core reception signal 3020 which can be processed by core 99, and transmits core reception signal 3020 to core 99. Also, upon receipt of a test packet from router node 2000, packet reception unit 3200 passes the test packet to core testing unit 3300. Here, a buffer may be provided within packet reception unit 3200 for holding a plurality of packets.

Upon passage of a test packet from packet reception unit 3200, core testing unit 3300 performs a testing work based on the contents of the test packet. Here, the test may be of any type, such as a structure test, a delay test, a margin test, a function test, and the like.

In this regard, the testing work refers to a general work related to a test, for example, a work for injecting test data included in a test packet into a scan chain through core 99, a work for supplying a scan chain with an instruction for executing a test on core 99 using test data through core 99, a work for extracting a test result from a scan chain through core 99 and converting the test result into a test packet, a work for setting a function test register through a test signal line defined by core 99 and JTAG, a work for supplying the function test register with an instruction, and the like.

In this way, the present exemplary embodiment is characterized in that inter-connection network 1000 is not only used for communications between a plurality of cores 99, but also used by test controller 500 to transmit a test packet in response to a test control request to control core testing unit 3300, forcing core testing unit 3300 to test core 99 in place of test controller 500.

In this way, it is possible to accomplish both collective testing of a plurality of cores 99 in parallel, and testing of cores 99 in various orders to flexibly test semiconductor integrated circuit 100 at high speeds.

Also, core testing unit 3300 may act for test controller 500 to supply core 99 with instructions and data through core reception signal 3020, and supply data through core transmission signal 3010 from core 99, in order to transmit and receive data for normal packets during the execution of a test.

Here, adapter 3000 connected to test controller 500 can be configured, for example, with the signal line for core transmission signal 3010 and the signal line for core reception signal 3020 being deleted from FIG. 17. When such a configuration is employed, core testing unit 3300 converts a test control request issued from test controller 500 into a test packet, and packet transmission unit 3100 transmits the test packet to router node 200. Additionally, core testing unit 3300 can copy the test packet. Packet reception unit 3200 in turn receives a test packet from router node 200, and core testing unit 3300 converts the test packet into a response to the test control request, and transmits the response to test controller 500.

Figure 18:
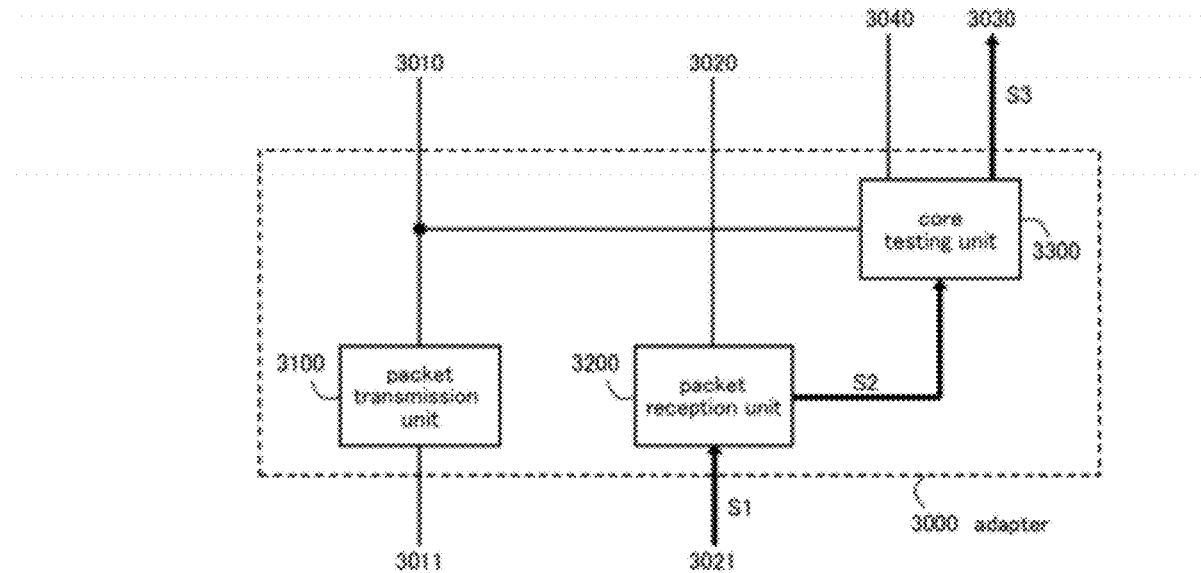
[FIG. 18] A diagram for describing operations of the adapter according to the present exemplary embodiment.

FIG. 18 is a diagram for describing exemplary operations of adapter 3000 shown in FIG. 17. In FIG. 18, a reference comprised of "S" and a number beside an arrow represents a step number. Described in this example are operations which are involved when test controller 500 has issued a test control request to inject test data into core 99 connected to test controller 500.

Step 1 (S1): Packet reception unit 3200 receives a test packet for the test control request issued from test controller 500.

Step 2 (S2): Packet reception unit 3200 passes the received test packet to core testing unit 3300.

Step 3 (S3): Core testing unit 3300 analyzes the test packet passed from packet reception unit 3200. As a result of the analysis, when core testing unit 3300 determines that the test packet indicates a test control request to inject test data into core 99 connected to core testing unit 3300 itself, core testing unit 3300 injects test data included in the test packet into core 99.

Figure 19:
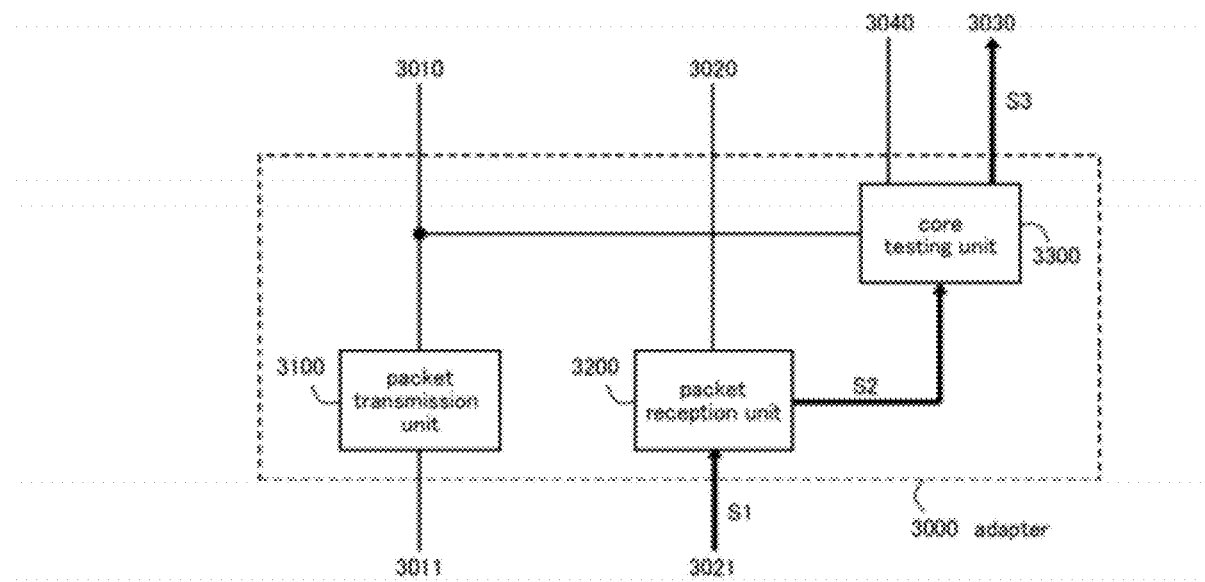
[FIG. 19] A diagram for describing operations of the adapter according to the present exemplary embodiment.

FIG. 19 is a diagram for describing exemplary operations of adapter 3000 shown in FIG. 17. In FIG. 19, a reference comprised of "S" and a number beside an arrow represents a step number. Described in this example are operations which are involved when test controller 500 has issued a test control request to execute a test for core 99 connected to test controller 500 itself.

Step 1 (S1): Packet reception unit 3200 receives a test packet for the test control request issued from test controller 500.

Step 2 (S2): Packet reception unit 3200 passes the received test packet to core testing unit 3300.

Step 3 (S3): Core testing unit 3300 analyzes the test packet passed from packet reception unit 3200. As a result of the analysis, when core testing unit 3300 determines that the test packet indicates a test control request to execute a test for core 99 connected to core testing unit 3300 itself, core testing unit 3300 supplies a test execution instruction to core 99 to start the test for core 99.

Figure 20:
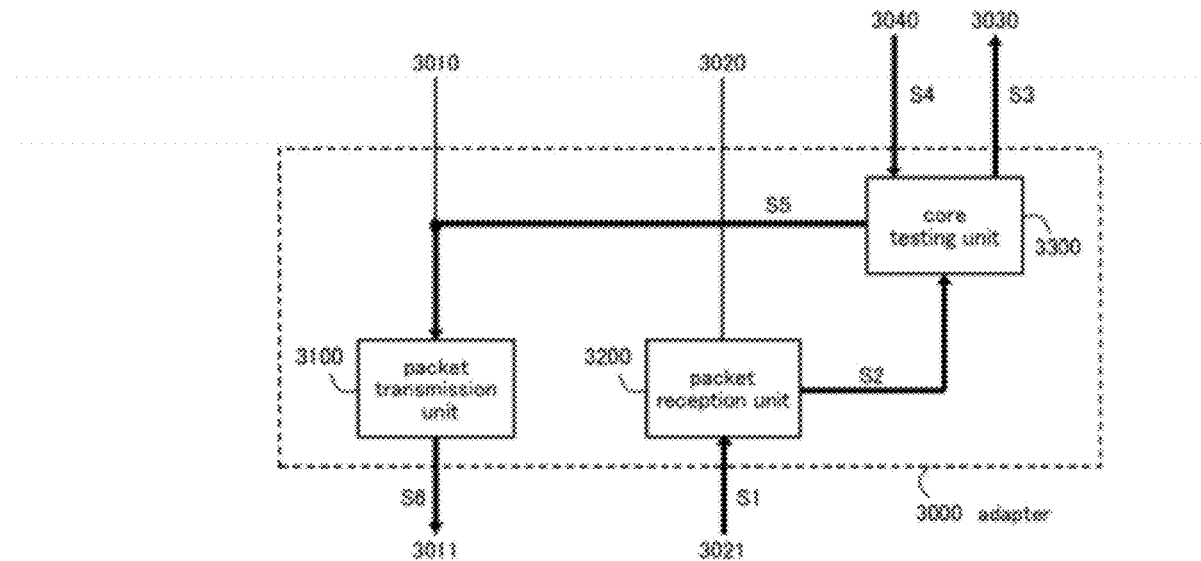
[FIG. 20] A diagram for describing operations of the adapter according to the present exemplary embodiment.

FIG. 20 is a diagram for describing exemplary operations of adapter 3000 shown in FIG. 17. In FIG. 20, a reference comprised of "S" and a number beside an arrow represents a step number. Described in this example are operations which occur when test controller 500 has issued a test control request to extract a test result from core 99 connected to adapter 3000 itself and to return the test result to test controller 500.

Step 1 (S1): Packet reception unit 3200 receives a test packet for the test control request issued from the test controller 500.

Step 2 (S2): Packet reception unit 3200 passes the received test packet to core testing unit 3300.

Step 3 (S3): Core testing unit 3300 analyzes the test packet passed from packet reception unit 3200. As a result of the analysis, when core testing unit 3300 determines that the test packet indicates a test control request to extract a test result from core 99 connected to core testing unit 3300 itself and to return the test result to test controller 500, core testing unit 3300 starts preparing the extraction of the test result from core 99.

Step 4 (S4): Core testing unit 3300 extracts the test result from core 99.

Step 5 (S5): Core testing unit 3300 addresses the test result extracted from core 99 to test controller 500, converts the test result into a test packet which is given a serial number, and passes the converted test packet to packet transmission unit 3100.

Step 6 (S6): Packet transmission unit 3100 transmits the test packet passed from core testing unit 3300 to router node 2000.

Figure 21:
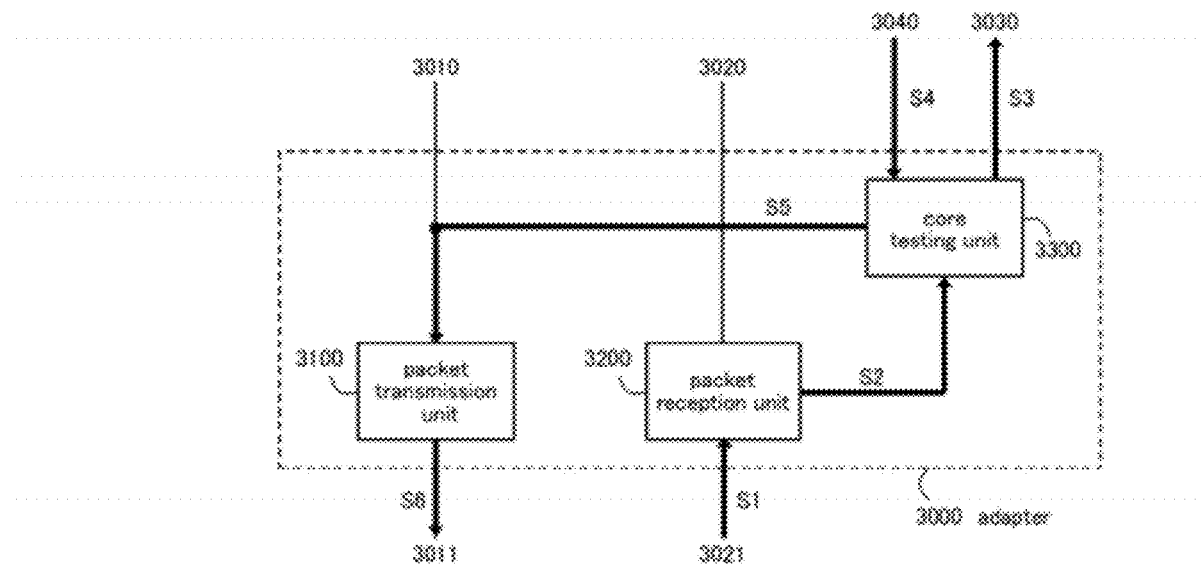
[FIG. 21] A diagram for describing operations of the adapter according to the present exemplary embodiment.

FIG. 21 is a diagram for describing exemplary operations of adapter 3000 shown in FIG. 17. In FIG. 21, a reference comprised of "S" and a number beside an arrow represents a step number. Described in this example are operations which are involved when test controller 500 has issued a test control request to inject test data into core 99 connected to adapter 3000 itself, execute a test, extract a test result, and return the test result to test controller 500.

Step 1 (S1): Packet reception unit 3200 receives a test packet for the test control request issued from test controller 500.

Step 2 (S2): Packet reception unit 3200 passes the received test packet to core testing unit 3300.

Step 3 (S3): Core testing unit 3300 analyzes the test packet passed from packet reception unit 3200. As a result of the analysis, when core testing unit 3300 determines that the test packet is a test control request to inject test data into core 99 connected to core testing unit 3300 itself, execute a test, extract a test result, and return the test result to test controller 500, core testing unit 3300 injects test data included in the test packet into core 99. Subsequently, core testing unit 3300 supplies a test execution instruction to core 99 to start a test for core 99.

Step 4 (S4): Core testing unit 3300 extracts a test result from core 99.

Step 5 (S5): Core testing unit 3300 addresses the test result extracted from core 99 to test controller 500, converts the test result into a test packet which is given a serial number, and passes the converted test packet to packet transmission unit 3100.

Step 6 (S6): Packet transmission unit 3100 transmits the test packet passed from core testing unit 3300 to router node 2000.

Figure 22:
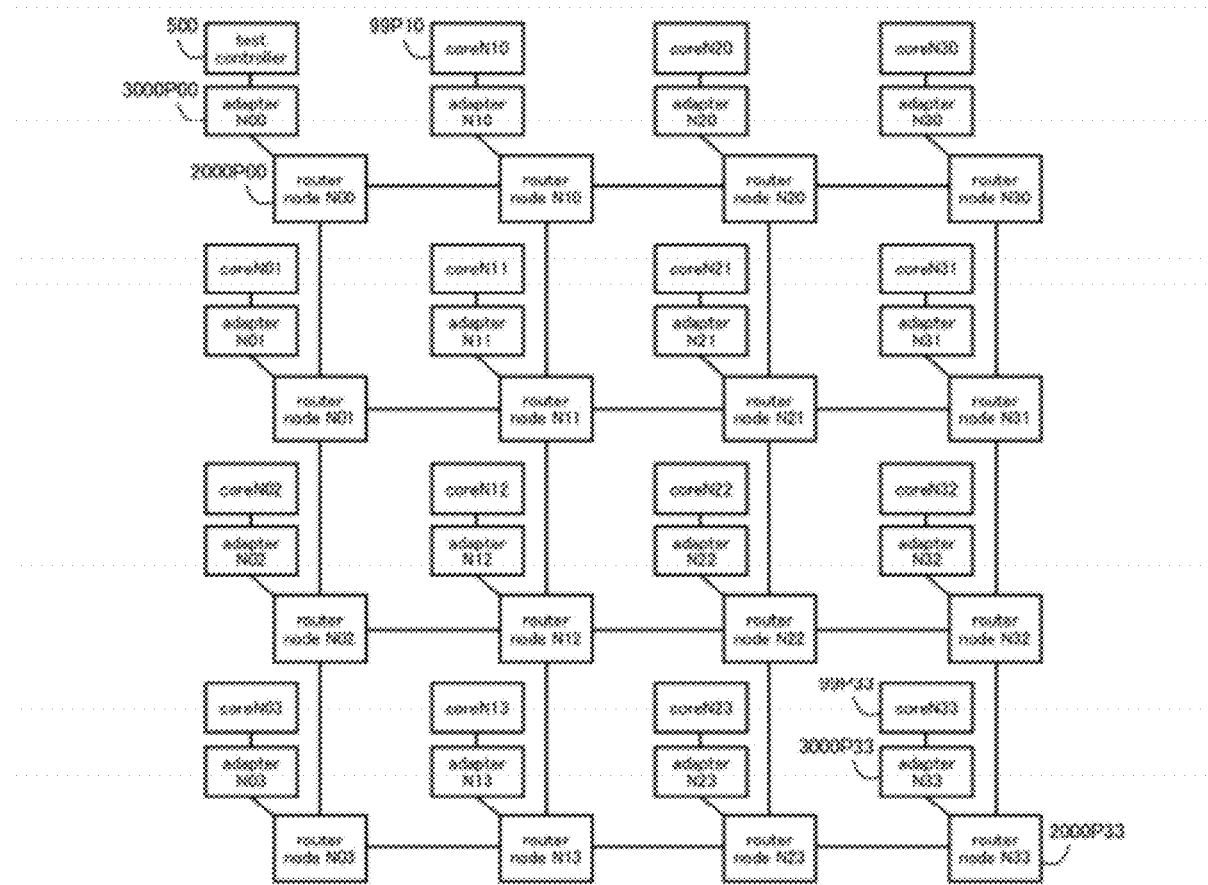
[FIG. 22] A diagram showing the configuration of a semiconductor integrated circuit according to the present exemplary embodiment.

FIG. 22 is a diagram showing a typical configuration of semiconductor integrated circuit 100 which comprises a plurality of cores 99 connected to inter-connection network 1000.

Referring to FIG. 22, semiconductor integrated circuit 100 comprises test controller 500, 15 cores 99P10~99P33, and 16 router nodes 2000P00~2000P33 and 16 adapters 3000P00~3000P33 which form part of inter-connection network 1000. Here, test controller 500 is connected to router node 3000P00 through adapter 3000P00, and remaining cores 99P10~99P33 are connected to adapters 3000P10~3000P33, while adapters 3000P10~3000P33 are connected to router nodes 2000P10~2000P33.

Router nodes 2000P00~2000P33 each comprise four channels for inputs and outputs, respectively, and form inter-connection network 1000 in a mesh structure as a whole. Of course, the configuration of inter-connection network 1000 is not limited to the mesh structure, but may employ a general structure of inter-connection network 1000.

Figure 23:
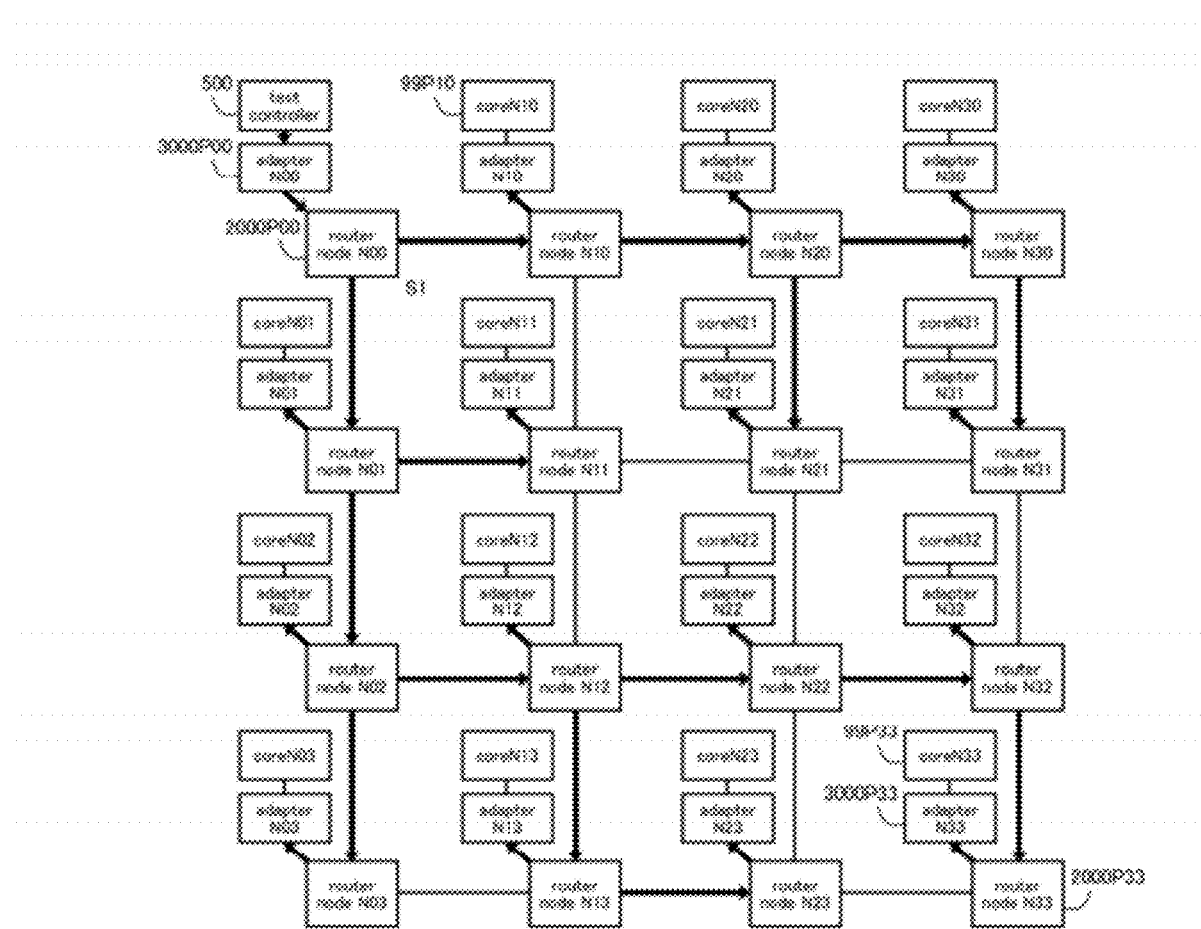
[FIG. 23] A diagram for describing operations of the semiconductor integrated circuit according to the present exemplary embodiment.

FIG. 23 is a diagram for describing exemplary operations of semiconductor integrated circuit 100 shown in FIG. 22. In FIG. 23, a reference comprised of "S" and a number beside an arrow represents a step number. Described in this example are operations which are involved when a test packet issued from test controller 500 as a test control request to inject test data into all cores 99P10~99P33 is transmitted to all adapters 3000P10~3000P33 except for adapter 3000P00 through broadcasting.

Step 1 (S1): Test controller 500 issues to adapter 3000P00 a test control request to inject test data into all cores 99P10~99P33. Next, adapter 3000P00 copies a test packet addressed to all cores 99P10~99P33, and transmits the copied test packet to router node 2000P00. Next, router node 2000P00 transmits all test packets to adjacent router nodes 2000P01 or 2000P10. Subsequently, each router node 2000P10~2000P33, which has received the test packet, transmits the test packet addressed thereto to adapter 3000P10~3000P33.

In this way, the features of inter-connection network 1000 can be exploited, and further, the test data can be readily copied in cooperation of test controller 500 with core testing unit 3300, thus effectively reducing a test time.

Figure 24:
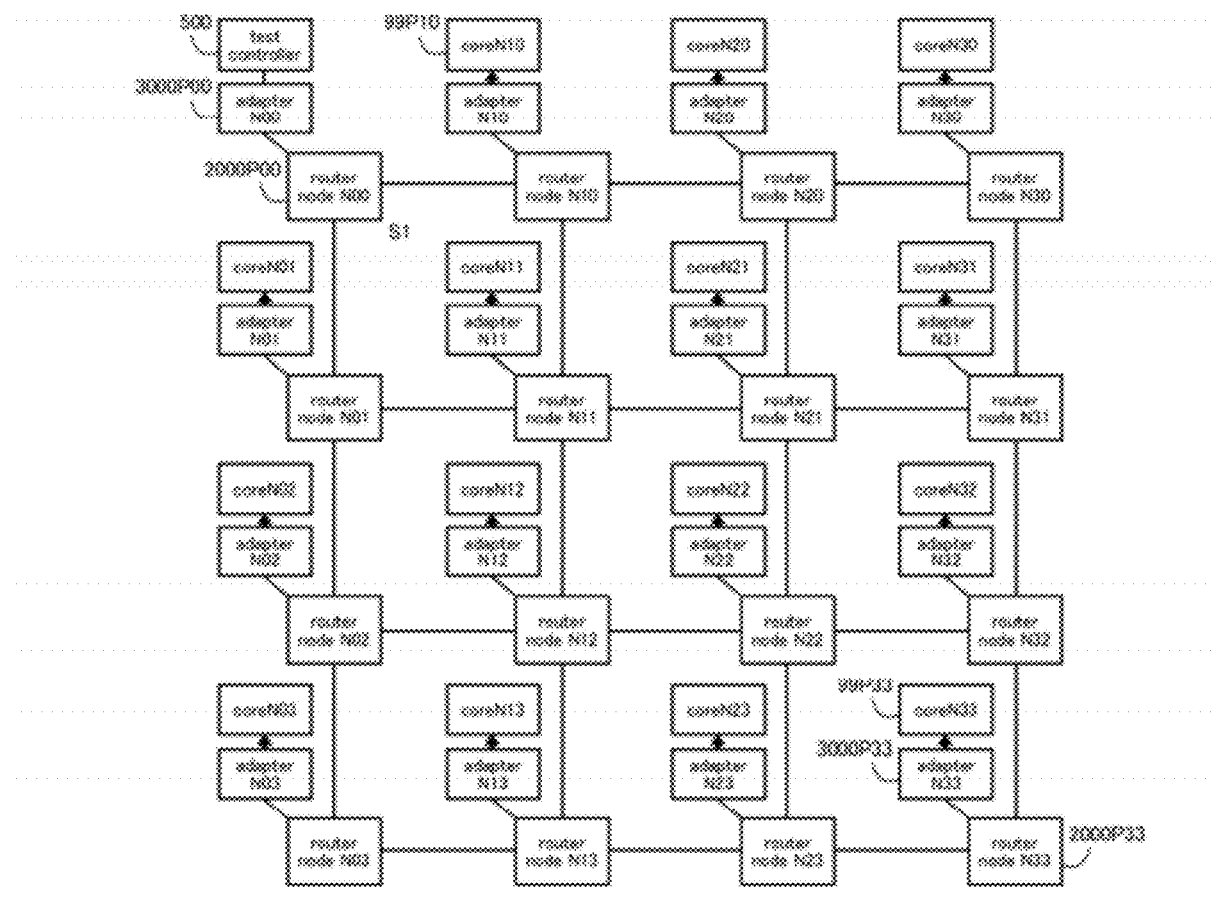
[FIG. 24] A diagram for describing operations of the semiconductor integrated circuit according to the present exemplary embodiment.

FIG. 24 is a diagram for describing exemplary operations of semiconductor integrated circuit 100 shown in FIG. 22. In FIG. 24, a reference comprised of "S" and a number beside an arrow represents a step number. Described in this example are operations which are involved when test data is injected into all cores 99P10~99P33.

Step 1 (S1): Adapters 3000P10~3000P33 except for adapter 3000P00 connected to test controller 500 inject test data into cores 99P10~99P33 connected thereto.

In this way, since the test data can be injected in parallel, a test time can be effectively reduced.

Figure 25:
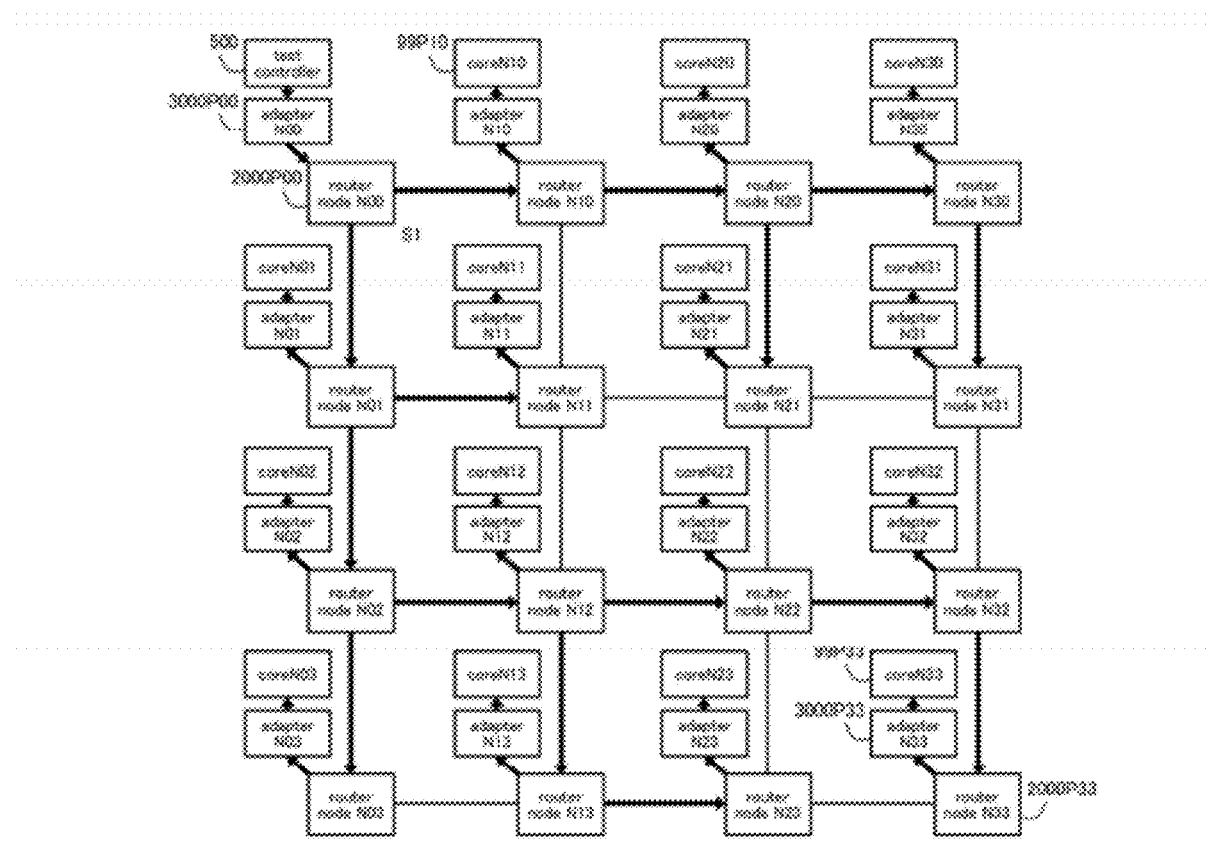
[FIG. 25] A diagram for describing operations of the semiconductor integrated circuit according to the present exemplary embodiment.

FIG. 25 is a diagram for describing exemplary operations of semiconductor integrated circuit 100 shown in FIG. 22. In FIG. 25, a reference comprised of "S" and a number beside an arrow represents a step number. Described in this example are operations which are involved when a test packet issued from test controller 500 as a test control request to execute a test for all cores 99P10~99P33 is transmitted to all adapters 3000P10~3000P33 except for adapter 3000P00 through broadcasting.

Step 1 (S1): Test controller 500 issues to adapter 3000P00 a test control request to execute a test for all cores 99P10~99P33. Next, adapter 3000P00 copies a test packet addressed to all cores 99P10~99P33, and transmits the copied test packets to router node 2000P00. Next, router node 2000P00 transmits all test packets to adjacent router nodes 2000P01 or 2000P10. Subsequently, each router node 2000P10~2000P33 which has received the test packet, transmits a test packet addressed thereto to adapters 3000P10~3000P33. Each adapter 3000P10~3000P33, which has received the test packet, supplies a test execution instruction to core 99P10~99P33 connected thereto to start the test.

Figure 26:
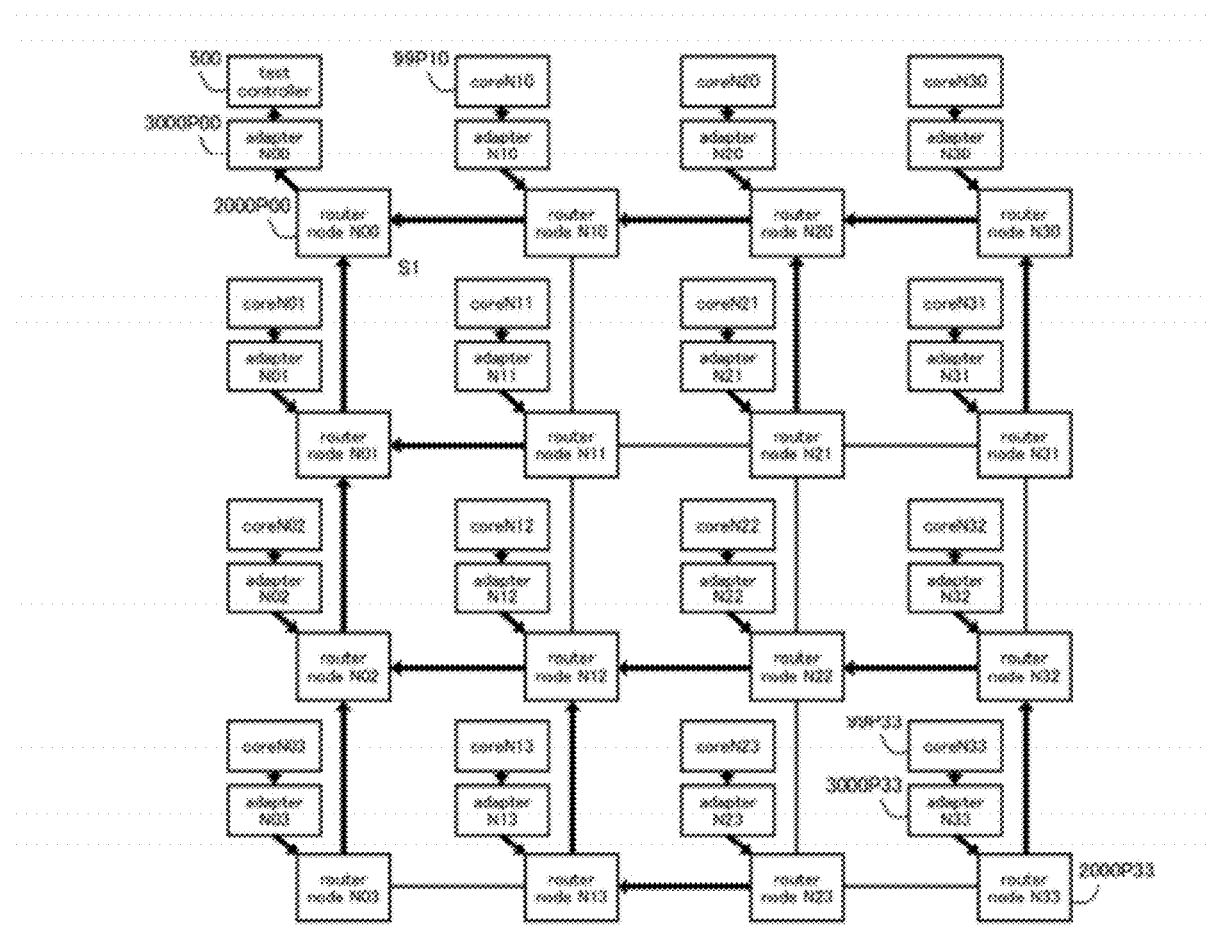
[FIG. 26] A diagram for describing operations of the semiconductor integrated circuit according to the present exemplary embodiment.

FIG. 26 is a diagram for describing exemplary operations of semiconductor integrated circuit 100 shown in FIG. 22. In FIG. 26, a reference comprised of "S" and a number beside an arrow represents a step number. Described in this example are operations which are involved when a test result is returned from core testing unit 3300 to test controller 500.

Step 1 (S1): Core testing units 3300 within adapters 3000P10~3000P33 except for adapter 3000P00 extract test results from cores 99P10~99P33 connected thereto. Then, core testing unit 3300 converts the test result into a test packet addressed to test controller 500, and transmits the converted test packet to router node 2000P10~2000P33. Each router node 2000P10~2000P33 transmits the test packet to test controller 500 in cooperation with other router nodes 2000.

Alternatively, test controller 500 can compare test results with one another, included in test packets received from core testing units 3300. In this way, since the test results can be compared without use of a tester or ICE, test times can be further reduced.

Figure 27:
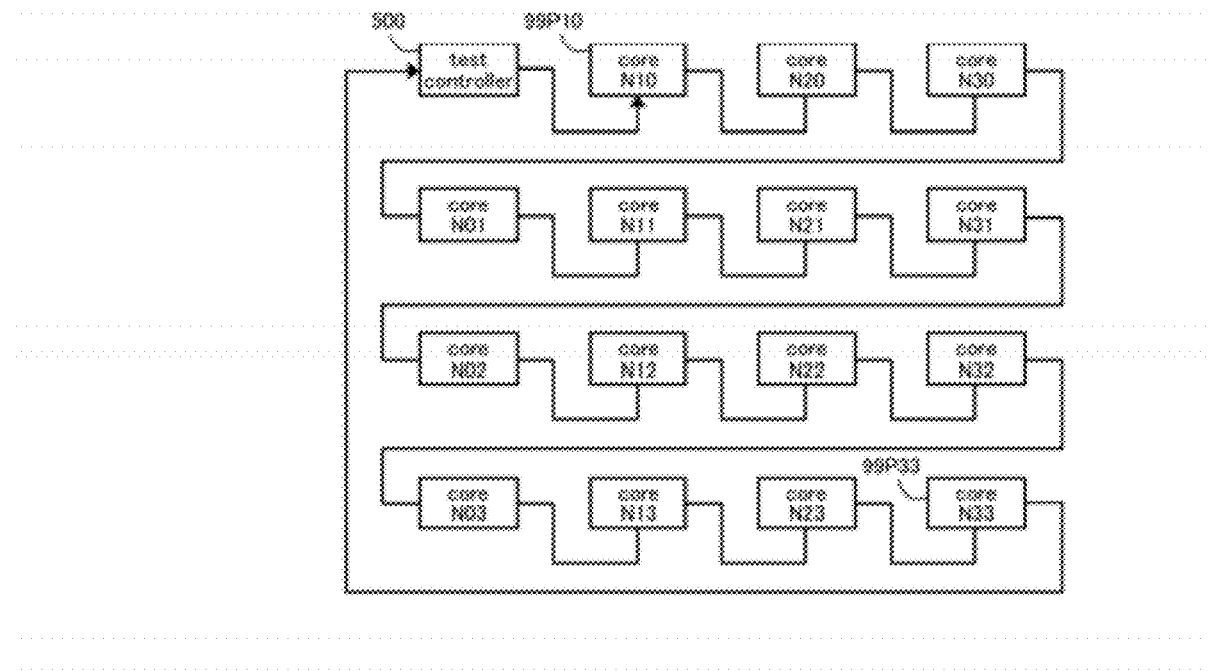
[FIG. 27] A diagram showing a connection relationship of cores during a testing work according to the present exemplary embodiment.

FIG. 27 is a diagram for describing an exemplary connection relationship among cores 99 within semiconductor integrated circuit 100 shown in FIG. 22 during a testing work.

Test controller 500 arranges the order of test results returned from cores 99P10~99P33. In this way, core 99P10 through core 99P33 can be presented to a tester or ICE as if they are connected in order within semiconductor integrated circuit 100.

Figure 28:
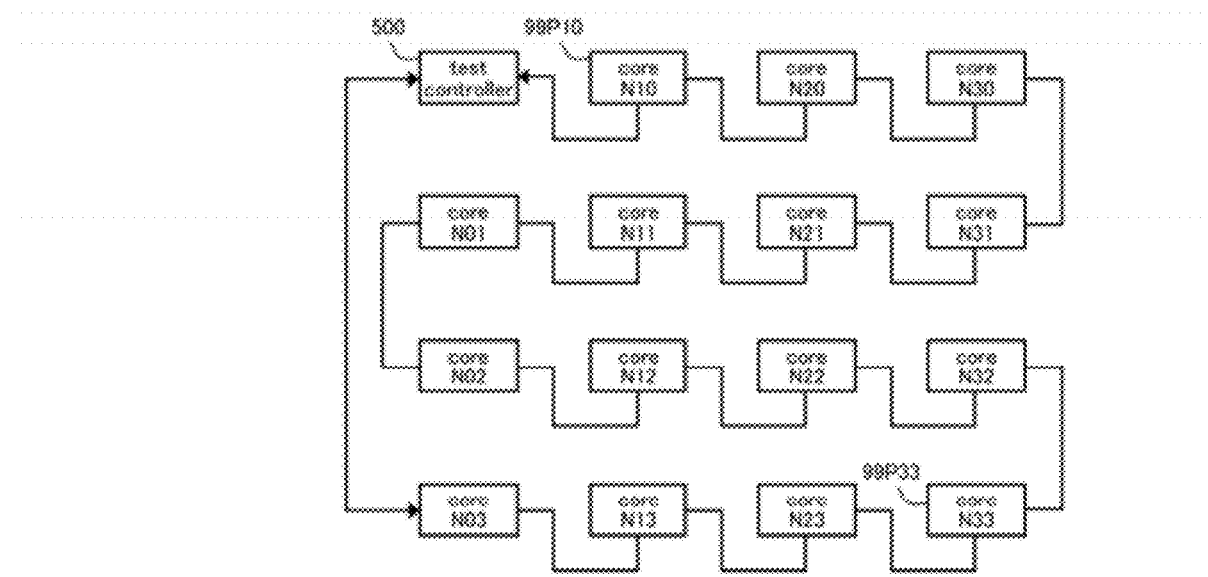
[FIG. 28] A diagram showing a connection relationship of cores during a testing work according to the present exemplary embodiment.

FIG. 28 is a diagram for describing an exemplary connection relationship among cores 99 within semiconductor integrated circuit 100 shown in FIG. 22 during a testing work.

Test controller 500 arranges the order of test results returned from cores 99P10~99P33. In this way, core P33 through core P10 can be presented to a tester or ICE as if they are connected in order, contrary to FIG. 27, within semiconductor integrated circuit 100.

As described above, a plurality of cores 99 can be virtually freely connected in cooperation of test controller 500 with core testing unit 3300.

Figure 29:
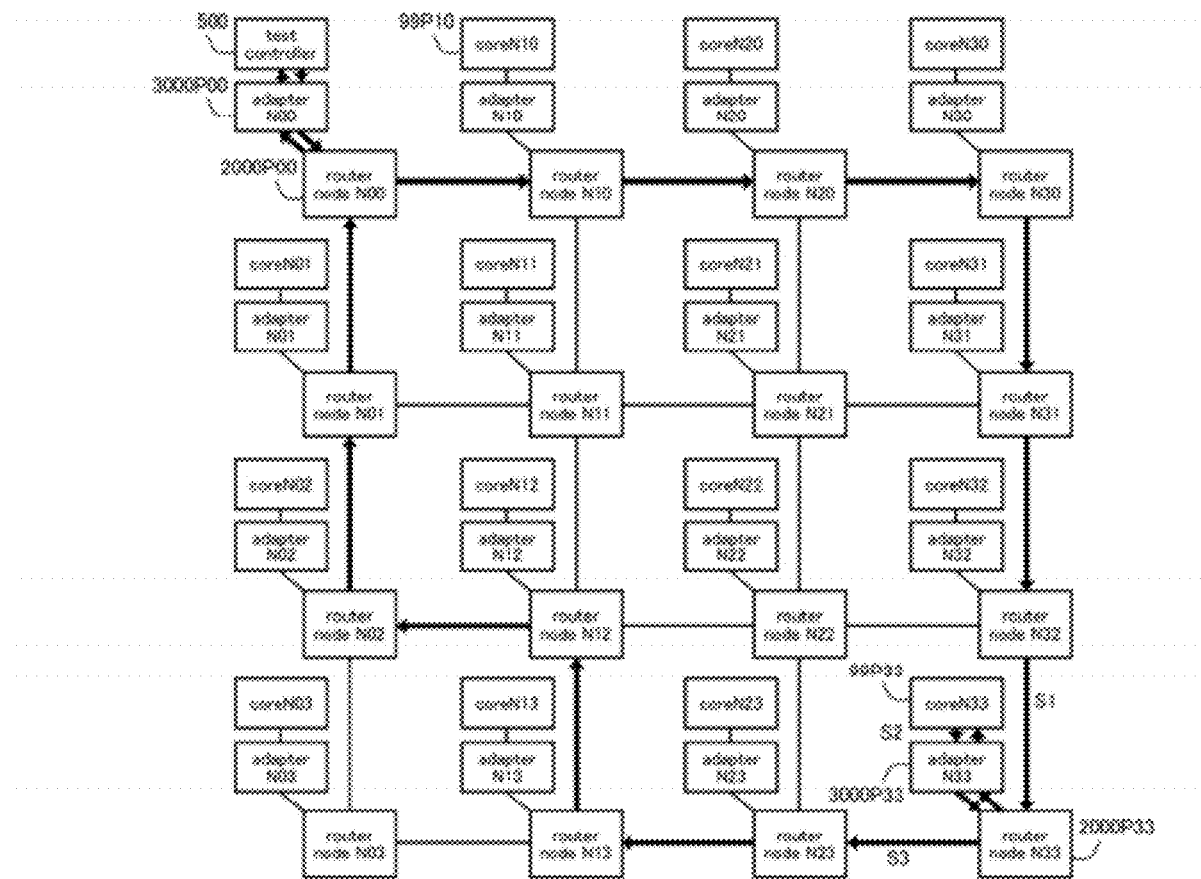
[FIG. 29] A diagram for describing operations of the semiconductor integrated circuit according to the present exemplary embodiment.

FIG. 29 is a diagram for describing exemplary operations of semiconductor integrated circuit 100 shown in FIG. 22. In FIG. 29, a reference comprised of "S" and a number beside an arrow represents a step number. Described in this example are operations which occur when test controller 500 has issued a test control request to inject test data into particular core 99P33, execute a test, extract a test result, and return the test result to test controller 500.

Step 1 (S1): Test controller 500 issues to adapter 3000P00 the test control request to subject core 99P33 to a test. In this event, the test control request includes test data as well. Next, adapter 3000P00 converts the test control request issued from test controller 500 into a test packet, and transmits the converted test packet to router node 2000P00. This test packet arrives at router node 2000P33 through intermediate router nodes 2000P10, 2000P20, 2000P30, 2000P31, and 2000P32. Router node 2000P33 transmits the arriving test packet to adapter 3000P33.

Step 2 (S2): Adapter 3000P33 analyzes the test packet received from router node 2000P33. As a result of the analysis, when adapter 3000P33 determines that the test packet is a test control request to inject test data into particular core 99P33, execute a test, and return the result of the test to test controller 500, adapter 3000P33 injects the test data into core 99P33 and executes the test for core 99P33, and subsequently extract the result of the test from core 99P33.

Step 3 (S3): Adapter 3000P33 converts the test result into a test packet addressed to test controller 500, and passes the converted test packet to router node 2000P33. This test packet arrives at router node 2000P00 through intermediate router nodes 2000P23, 2000P13, 2000P12, 20000P02, and 2000P01. Router node 2000P00 returns the arriving test packet to test controller 500 through adapter 3000P00.

Figure 30:
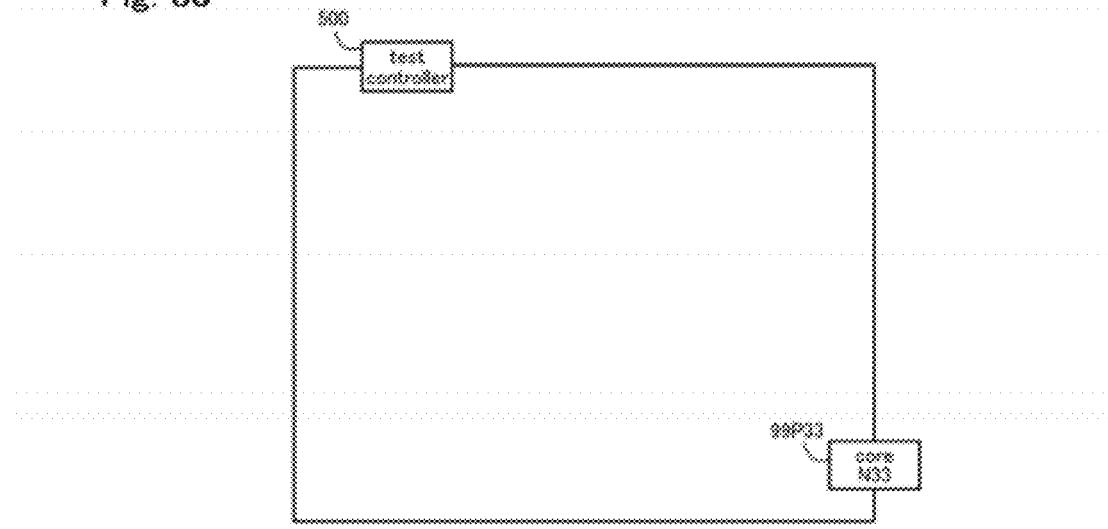
[FIG. 30] A diagram showing a connection relationship of cores during a testing work according to the present exemplary embodiment.

FIG. 30 is a diagram for describing an exemplary connection relationship among cores 99 within semiconductor integrated circuit 100 shown in FIG. 22 during a testing work. FIG. 30 corresponds to the test control in FIG. 29.

Test controller 500 can present core 99P33 to a tester or ICE as if there is core 99P33 alone within semiconductor integrate circuit 100 by transmitting a test packet to particular core 99P33 alone.

In this way, since a test can be conducted only for core 99 which must be subjected to a preponderance tested, the coverage of the test is improved. Further, since a test can be conducted independently of other cores 99, this also contributes to a reduction in the test time.

Figure 31:
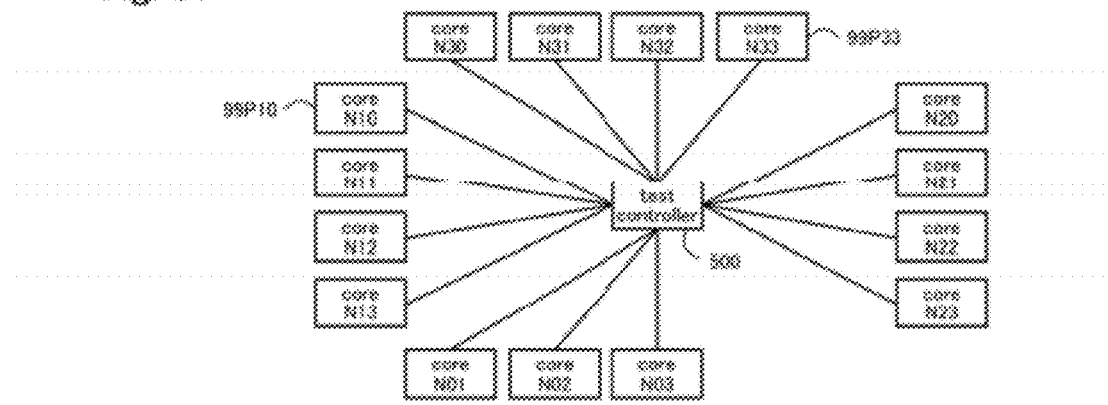
[FIG. 31] A diagram showing a connection relationship of cores during a testing work according to the present exemplary embodiment.

FIG. 31 is a diagram for describing an exemplary connection relationship among cores 99 within semiconductor integrated circuit 100 shown in FIG. 22 during a testing work. FIG. 31 shows a connection relationship when the test control of FIG. 29 is expanded to all cores 99.

Test controller 500 can present all cores 99P10~99P33 to a tester or ICE as if they were in parallel within semiconductor integrated circuit 100 by directly transmitting test packets to all cores 99P10~99P33.

In this way, tests can be processed in parallel, making it possible to contribute to a reduction in test time.

Figure 32:
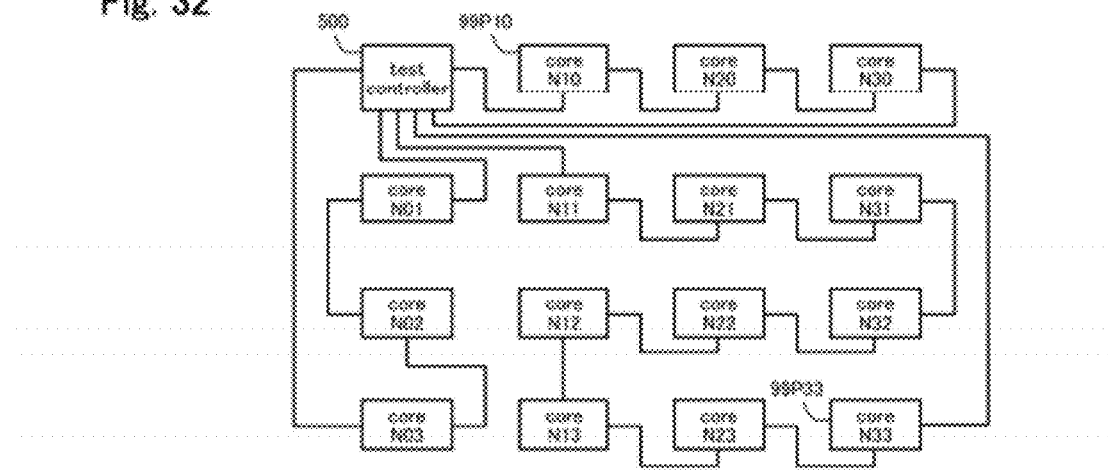
[FIG. 32] A diagram showing a connection relationship of cores during a testing work according to the present exemplary embodiment.

FIG. 32 is a diagram for describing an exemplary connection relationship among cores 99 within semiconductor integrated circuit 100 shown in FIG. 22 during a testing work.

Test controller 500 can appropriately group cores 99P10~99P33 in accordance with test loads on cores 99P10~99P33 within semiconductor integrated circuit 100. For example, in FIG. 32, cores 99P01, 99P02, and 99P03 are placed together into one group; cores 99P10, 99P20, and 99P30 into one group; and the remaining cores into one group.

In this way, it is possible to conceal a test load which differs from one core 99 to another, thus implementing more efficient tests.

Figure 33:
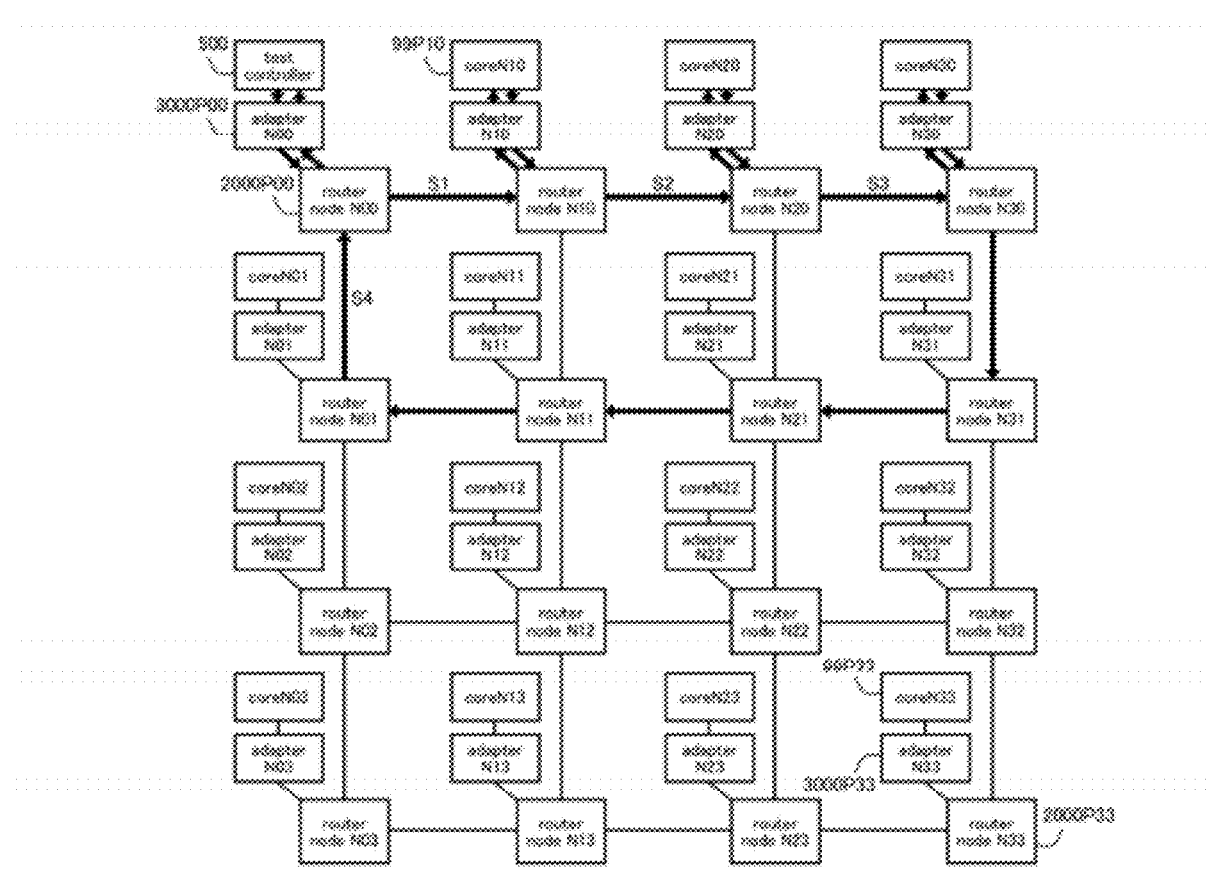
[FIG. 33] A diagram for describing operations of the semiconductor integrated circuit according to the present exemplary embodiment.

FIG. 33 is a diagram for describing exemplary operations of semiconductor integrated circuit 100 shown in FIG. 22. In FIG. 33, a reference comprised of "S" and a number beside an arrow represents a step number. Described in this example are operations which are involved when a pipeline test is executed.

Step 1 (S1): Test controller 500 issues to adapter 3000P00 a test control request to inject test data into core 99P10, execute a test, extract a test result, pass the test result to core 99P20, and further execute tests the cores up to 99P30 in order using the test result, and extract test results, i.e., execute a so-called pipeline test. Next, adapter 3000P00 converts the test control request issued from test controller 500 into a test packet, and transmits the converted test packet to adapter 3000P10 through router nodes 2000P00 and 2000P10. Next, adapter 3000P10 injects the test data into core 99P10 and executes a test.

Step 2 (S2): Adapter 3000P10 extracts a test result from core 99P10, and transmits the extracted test result to adapter 3000P20 through router nodes 3000P10 and 3000P20. In this event, the test result extracted from core 99P10 includes the test data. Next, adapter 3000P20 injects the test data into core 99P20 and executes a test using the test result.

Step 3 (S3): Adapter 3000P20 extracts a test result from core 99P20, and transmits the extracted test result to adapter 3000P30 through router nodes 3000P20 and 3000P30. Adapter 3000P30 injects the test data into core 99P30 and executes a test using the test result.

Step 4 (S4): Adapter 3000P30 extracts a test result from core 99P30, and transmits the extracted test result to adapter 3000P00 through router nodes 3000P30, 3000P31, 3000P21, 3000P11, 3000P01, and 3000P00. Adapter 3000P00 transmits the test result to test controller 500.

Of course, cores 99 tested in a pipeline manner as described above may include all cores 99 or some of cores 99, and the test results may be passed between cores 99 in any order. In other words, tests can be conducted by taking advantage of the flexibility of inter-connection network 1000.

In this way, the present exemplary embodiment can conduct a test, taking advantage of the flexibility of inter-connection network 1000, without using of test controller 500, by ordering test results and transferring the ordered test results.

Figure 34:
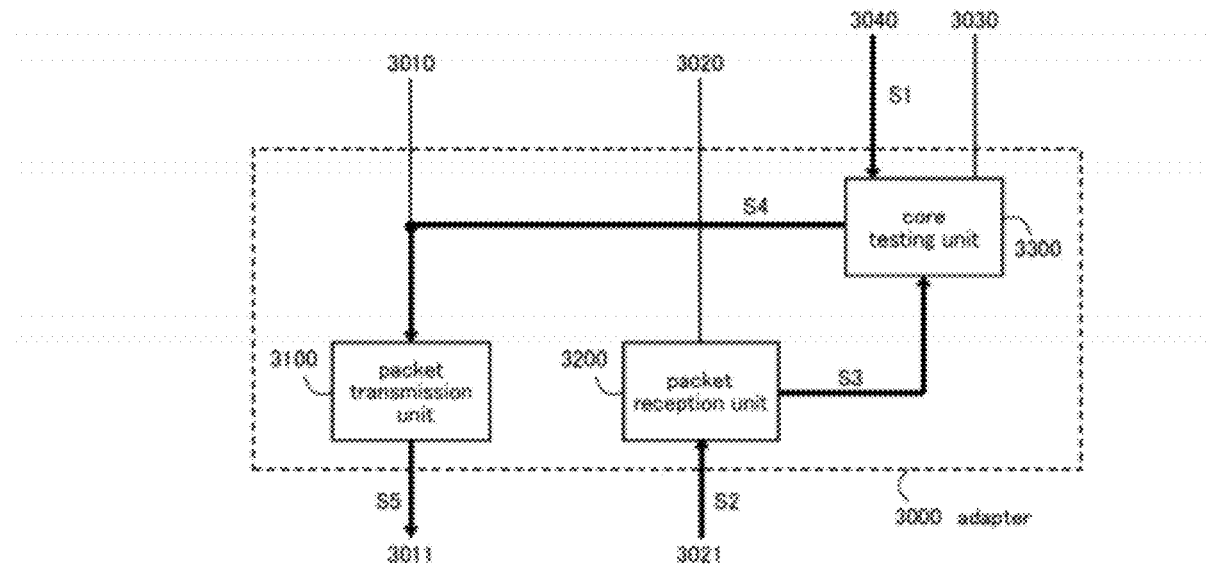
[FIG. 34] A diagram for describing other operations of the adapter according to the present exemplary embodiment.

FIG. 34 is a diagram for describing other exemplary operations of adapter 3000 shown in FIG. 17. In FIG. 34, a reference comprised of "S" and a number beside an arrow represents a step number. Described in this example are operations which occur when core testing unit 3300 comprises a function of comparing a test result of core 99 connected thereto with a test result from the outside.

Step 1 (S1): Core testing unit 3300 extracts a test result from core 99 connected thereto.

Step 2 (S2): Packet reception unit 3200 passes the test packet received from another external core testing unit 3300 to core testing unit 3300.

Step 3 (S3): Core testing unit 3300 analyzes the test packet passed from packet reception unit 3200. As a result of the analysis, when core testing unit 3300 determines that the test packet is a test control request to compare the test result from core 99 connected thereto with the test result from other core testing unit 3300, core testing unit 3300 compares the test result included in the test packet with the test result extracted at step 1.

Step 4 (S4): Core testing unit 3300 converts the result of the comparison at step 3 into a test packet addressed to test controller 500, and passes the converted test packet to packet transmission unit 3100.

Step 5 (S5): Packet transmission unit 3100 transmits the test packet passed from core testing unit 3300 to router node 2000.

Figure 35:
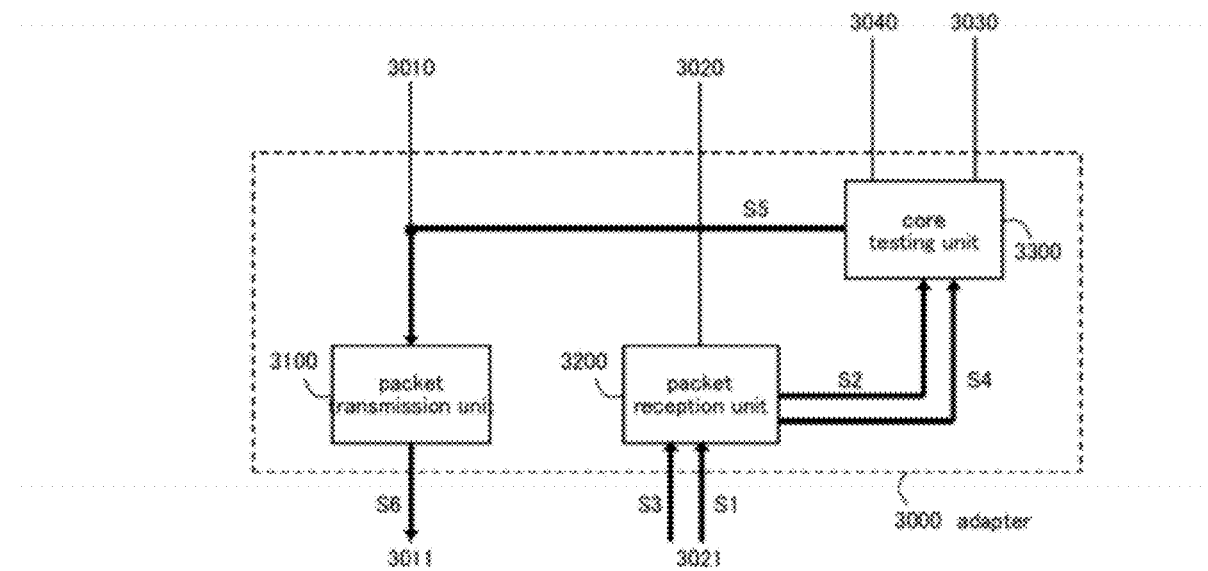
[FIG. 35] A diagram for describing other operations of the adapter according to the present exemplary embodiment.

FIG. 35 is a diagram for describing other exemplary operations of adapter 3000 shown in FIG. 17. In FIG. 35, a reference comprised of "S" and a number beside an arrow represents a step number. Described in this example are operations which are involved when core testing unit 3300 comprises a function of comparing two test results from the outside.

Step 1 (S1): Packet reception unit 3200 receives a test packet from other external core testing unit 3300.

Step 2 (S2): Packet reception unit 3200 passes the received test packet to core testing unit 3300. Core testing unit 3300 analyzes the test packet passed from packet reception unit 3200. As a result of the analysis, when core testing unit 3300 determines that the test packet is a test control request to compare two test results from other core testing units 3300, core testing unit 3300 waits for another test packet.

Step 3 (S3): Packet reception unit 3200 receives a test packet from further external core testing unit 3300.

Step 4 (S4): Packet reception unit 3200 passes the received test packet to core testing unit 3300. Core testing unit 3300 analyzes the test packet passed from packet reception unit 3200. As a result of the analysis, when core testing unit 3300 determines that the test packet is a test control request to compare two test results from other core testing units 3300, core testing unit 3300 compares a test result included in the test packet with the test result included in the test packet passed from packet reception unit 3200 at step 2.

Step 5 (S5): Core testing unit 3300 converts the result of the comparison at step 4 into a test packet addressed to test controller 500, and passes the converted test result to packet transmission unit 3100.

Step 6 (S6): Packet transmission unit 3100 transmits the test packet passed from core testing unit 3300 to the router node.

Additionally, the test packet for a test control request to compare test results may comprise a field for clarifying test packets intended for a comparison in the header. In other words, the test packet may specify which test packets should be compared with each other.

Figure 36:
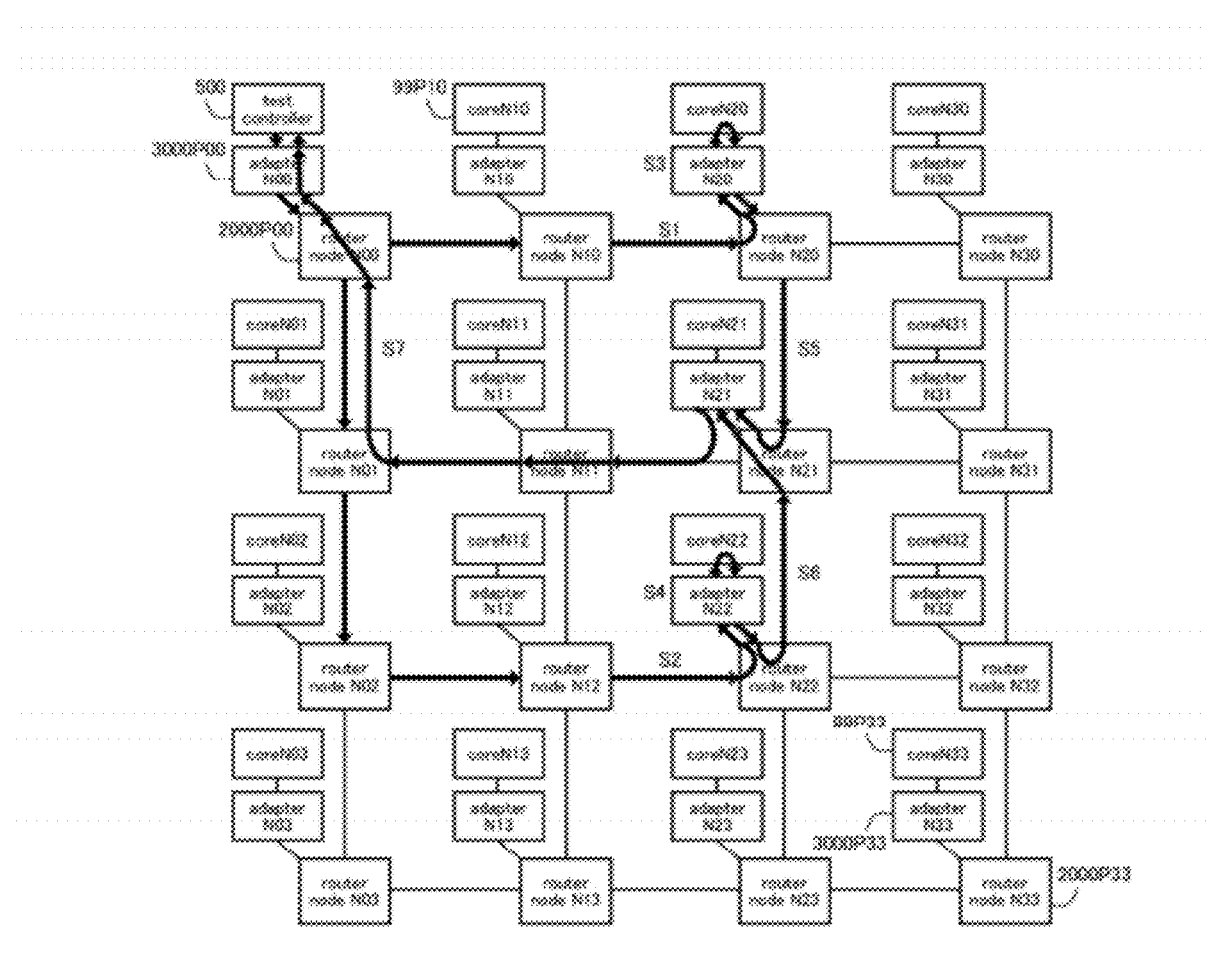
[FIG. 36] A diagram for describing other operations of the semiconductor integrated circuit according to the present exemplary embodiment.

FIG. 36 is a diagram for describing exemplary operations of semiconductor integrated circuit 100 shown in FIG. 22. In FIG. 36, a reference comprised of "S" and a number beside an arrow represents a step number. Described in this example are operations which occur when adapter 3000P21 including core testing unit 3300 having the comparison function shown in FIG. 35 compares test results.

Step 1 (S1): Test controller 500 issues to adapter 3000P00 a test control request to inject test data into core 99P20, execute a test, extract a test result, transfer the test result to adapter 3000P21, and force adapter 3000P21 to compare the test result. Next, adapter 3000P00 converts the test control request issued from test controller 500 into a test packet, and transmits the converted test packet to adapter 3000P20 through router nodes 2000P00, 2000P10, and 2000P20.

Step 2 (S2): Test controller 500 issues to adapter 3000P00 a test control request to inject test data into core 99P22, execute a test, extract a test result, transfer the test result to adapter 3000P21, and force adapter 3000P21 to compare the test result. Next, adapter 3000P00 converts the test control request issued from test controller 500 into a test packet, and transmits the converted test packet to adapter 3000P22 through router nodes 2000P00, 2000P01, 2000P02, 2000P12, and 2000P22.

Step 3 (S3): Adapter 3000P20 injects test data into core 99P20, and executes a test.

Step 4 (S4): Adapter 3000P22 injects test data into core 99P22, and executes a test.

Step 5 (S5): Adapter 3000P20 converts a test result extracted from core 99P20 into a test packet, and transmits the converted test packet to adapter 3000P21 through router nodes 2000P20 and 2000P21.

Step 6 (S6): Adapter 3000P22 converts a test result extracted from core 99P22 into a test packet, and transmits the converted test packet to adapter 3000P21 through router nodes 2000P22 and 2000P21.

Step 7 (S7): Adapter 3000P21 compares the test result of core 99P20 with the test result of core 99P22. Then, adapter 3000P21 converts the result of the comparison into a test packet, and transmits the converted test packet to adapter 3000P00 through router nodes 2000P21, 2000P11, 2000P01, and 2000P00. Then, test controller 500 takes over the result of the comparison.

Of course, in the comparison of test results by adapter 300 as described above, adapter 3000 may compare test results from all cores 99 or compare test results from some of cores 99. Also, adapter 3000 may determine how to virtually connect cores 99 with one another during a testing work and compare test results of cores 99 with each other.

As described above, in the present exemplary embodiment, not only test controller 500 is provided with a function of comparing test results, but also core testing unit 3300 of adapter 3000 is provided with the comparison function. In this way, test results can be compared without using of test controller 500, taking advantage of the flexibility of inter-connection network 1000, so that a test time can be further reduced.

Also, in the present exemplary embodiment, the cores within inter-connection network 1000 can be freely placed into groups, so that cores not being tested can be operated in arbitrary number, in arbitrary arrangement, and in arbitrary execution order. More specifically, depending on operating modes of the cores not being tested, it is possible to artificially vary the amount of noise such as signal noise, cross-talk noise, power noise, heat, and the like, which are produced in cores being tested. Accordingly, semiconductor integrated circuit 100 can undergo not only a conventional test according to logical values but also a margin test according to the operation environment which produces such noise.

Further, in the present exemplary embodiment, the cores within inter-connection network 1000 can be freely placed into groups in cooperation of test controller 500 with core testing unit 3300, so that the parallelism of test signal lines within semiconductor integrated circuit 100 can be matched with test parallelism of a tester or ICE external to semiconductor integrated circuit 100. Specifically, since the test signal lines can be virtually configured such that they can undergo a parallel test by a tester or ICE, an optimal configuration of the test signal lines can be implemented in accordance with a specified number of parallel tests executed by the tester or ICE. If an interface of test controller 500 with a tester or ICE does not support connections of virtual test signal lines, a chip called "BOST" (Built Off Self Test) may be provided externally to semiconductor integrated circuit 100 to support the virtual test signal lines. Alternatively, a plurality of interface parts may be provided, although there are limitations to the maximum number of executed parallel tests.

While the foregoing exemplary embodiment has been described in connection with semiconductor integrated circuit 100, given as an example, which previously comprises inter-connection network 1000 for communications among cores 99, a dedicated inter-connection network may be provided for communication of test packets.

Also, while the foregoing exemplary embodiment has been described in connection with an example where inter-connection network 1000, through which a plurality of cores 99 are connected, is provided within semiconductor integrated circuit 100, the present invention is not so limited, but can be applied to semiconductor integrated circuit 100 which is externally provided with inter-connection network 1000.

While the present invention has been described with reference to some exemplary embodiments, the present invention is not limited to the exemplary embodiments described above. The present invention can be modified in configuration and details in various manners which can be understood by those skilled in the art without departing from the scope of the present invention.

The invention claimed is:

1. A semiconductor integrated circuit comprising a plurality of cores connected to an inter-connection network, characterized by:
comprising a test controller connected to said inter-connection network for issuing a test control request related to a test of said cores through said inter-connection network,
wherein said inter-connection network comprises a plurality of adapters which serve as connection interfaces for said plurality of cores and said test controller, respectively, and a plurality of routers for connecting between said plurality of adapters, and
said adapter connected to said core comprises a core testing unit for conducting a test for said core connected to said adapter, in place of said test controller, based on the test control request received from said test controller through said inter-connection network.

2. The semiconductor integrated circuit according to claim 1, characterized in that said test controller issues the test control request intended for all or part of said plurality of cores.

3. The semiconductor integrated circuit according to claim 2, characterized in that said adapter connected to said test controller copies the test control request from said test controller for all or part of said plurality of cores.

4. The semiconductor integrated circuit according to claim 1, characterized in that said test controller issues, as the test control request, a request for injecting test data into said core, a request for executing a test for said core using the test data, and a request for extracting a test result from said core.

5. The semiconductor integrated circuit according to claim 4, characterized in that said core testing unit transmits a test result from a core connected thereto to said test controller through said inter-connection network.

6. The semiconductor integrated circuit according to claim 5, characterized in that said test controller compares test results with one another from said core testing units.

7. The semiconductor integrated circuit according to claim 6, characterized in that said test controller arranges the order of the test results from said core testing units.

8. The semiconductor integrated circuit according to claim 4, characterized in that said test controller further issues, as the test control request, a request for transferring the test result extracted from said core to another core.

9. The semiconductor integrated circuit according to claim 8, characterized in that said core testing unit transmits a test result from a core connected thereto to another core testing unit through said inter-connection network.

10. The semiconductor integrated circuit according to claim 9, characterized in that said core testing unit compares a test result from a core connected thereto with a test result from another core testing unit.

11. The semiconductor integrated circuit according to claim 9, characterized in that said core testing unit compares test results from other core testing units with each other.

12. A method of testing a semiconductor integrated circuit comprising a plurality of cores connected to an inter-connection network,
wherein a test controller is provided for connection to said inter-connection network, said inter-connection network comprising a plurality of adapters which serve as connection interfaces for said plurality of cores and said test controller, respectively, and a plurality of routers for connecting between said plurality of adapters,
said testing method characterized by comprising:
a test control request issuing step where said test controller issues a test control request related to a test of said cores through said inter-connection network; and
a core test acting step where a core testing unit within said adapter connected to said core conducts a test for said core connected to said adapter, in place of said test controller, based on the test control request received from said test controller through said inter-connection network.

13. The testing method according to claim 12, characterized in that said test control request issuing step includes issuing the test control request for all or part of said plurality of cores.

14. The testing method according to claim 13, characterized by further comprising a test control request copying step where said adapter connected to said test controller copies the test control request from said test controller for all or part of said plurality of cores.

15. The testing method according to claim 12, characterized in that said test control request issuing step includes issuing, as the test control request, a request for injecting test data into said core, a request for executing a test for said core using the test data, and a request for extracting a test result from said core.

16. The testing method according to claim 15, characterized by further comprising a test result transmitting step where said core testing unit transmits a test result from a core connected thereto to said test controller through said inter-connection network.

17. The testing method according to claim 16, characterized by further comprising a test result comparing step where said test controller compares test results with each another from said core testing units.

18. The testing method according to claim 17, characterized by further comprising a test result arranging step where said test controller arranges the order of the test results from said core testing units.

19. The testing method according to claim 15, characterized in that said test control request issuing step further includes issuing, as the test control request, a request for transferring the test result extracted from said core to another core.

20. The testing method according to claim 19, characterized by further comprising a test result transmitting step where said core testing unit transmits a test result from a core connected thereto to another core testing unit through said inter-connection network.

21. The testing method according to claim 20, characterized by further comprising a test result comparing step where said core testing unit compares a test result from a core connected thereto with a test result from another core testing unit.

22. The testing method according to claim 20, characterized by further comprising a test result comparing step where said core testing unit compares test results from other core testing units with each other.

* * * * *